(12) United States Patent
    Shin et al.

(10) Patent No.: US 11,749,326 B2
(45) Date of Patent: Sep. 5, 2023

(54) DYNAMIC RANDOM ACCESS MEMORY (DRAM) DEVICE AND MEMORY CONTROLLER THEREFOR

(71) Applicant: SAMSUNG ELECTRONICS CO., LTD., Suwon-si (KR)

(72) Inventors: Seung-Jun Shin, Incheon (KR); Tae-Young Oh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/862,718

(22) Filed: Jul. 12, 2022

(65) Prior Publication Data

US 2022/0351764 A1    Nov. 3, 2022

Related U.S. Application Data

(63) Continuation of application No. 17/387,036, filed on Jul. 28, 2021, which is a continuation of application No. 16/874,916, filed on May 15, 2020, now Pat. No. 11,081,152, which is a continuation of application No. 16/717,742, filed on Dec. 17, 2019, now Pat. No.
(Continued)

(30) Foreign Application Priority Data

Sep. 8, 2015    (KR) .................. 10-2015-0126786

(51) Int. Cl.
    *G11C 8/06*      (2006.01)
    *G11C 8/18*      (2006.01)
    *G11C 8/10*      (2006.01)
    *G11C 7/22*      (2006.01)
    *G11C 7/10*      (2006.01)
    *G11C 11/4076*   (2006.01)
    *G06F 3/06*      (2006.01)
    *G06F 13/16*     (2006.01)

(52) U.S. Cl.
    CPC .................. *G11C 8/06* (2013.01); *G06F 3/06* (2013.01); *G06F 13/1689* (2013.01); *G11C 7/10* (2013.01); *G11C 7/1045* (2013.01); *G11C 7/22* (2013.01); *G11C 8/10* (2013.01); *G11C 8/18* (2013.01); *G11C 11/4076* (2013.01); *G11C 7/1057* (2013.01)

(58) Field of Classification Search
    CPC .... G11C 8/18; G11C 8/10; G11C 8/06; G11C 7/10; G11C 7/22; G11C 11/4076; G11C 7/1045; G11C 7/1057; G06F 3/06
    See application file for complete search history.

(56) References Cited

U.S. PATENT DOCUMENTS 6,202,119 B1    3/2001    Manning
6,366,992 B2    4/2002    Manning
(Continued)

OTHER PUBLICATIONS

U.S. Office action received in copending U.S. Appl. No. 17/387,036 dated Dec. 7, 2022.

*Primary Examiner* — Ajay Ojha
(74) *Attorney, Agent, or Firm* — Lee IP Law, P.C.

(57) ABSTRACT

A memory system includes a memory controller and a memory. The memory controller selectively operates in a first mode and a second mode. In the first mode, the memory controller transmits a first command continuously during a plurality of clock cycles. In the second mode, the memory controller to mix a second command with the first command and transmit the mixture of the first command and the second command. The memory changes command latch timing depending on the first or second mode.

20 Claims, 18 Drawing Sheets

Related U.S. Application Data

10,930,330, which is a continuation of application No. 16/169,178, filed on Oct. 24, 2018, now Pat. No. 10,579,263, which is a continuation of application No. 15/690,379, filed on Aug. 30, 2017, now Pat. No. 10,114,548, which is a continuation of application No. 15/180,175, filed on Jun. 13, 2016, now Pat. No. 9,754,649.

(56) References Cited

U.S. PATENT DOCUMENTS

| | | |
|---|---|---|
| 6,510,095 B1 | 1/2003 | Maatsuzaki et al. |
| 8,094,507 B2 | 1/2012 | Morgan |
| 8,332,590 B1 | 12/2012 | Rohana et al. |
| 8,654,603 B2 | 2/2014 | Tak et al. |
| 2004/0172499 A1 | 9/2004 | Roohparvar |
| 2010/0061156 A1 | 3/2010 | Sunaga et al. |
| 2012/0106229 A1 | 5/2012 | Kondo |
| 2013/0077393 A1 | 3/2013 | Ferrario et al. |
| 2014/0215175 A1 | 7/2014 | Kasorla et al. |
| 2015/0043297 A1 | 2/2015 | Hong |
| 2015/0317096 A1 | 11/2015 | Bains |

FIG. 4

| COMMAND | | CS | CA0 | CA1 | CA2 | CA3 | CA4 | CA5 | CA6 | CK EDGE |
|---|---|---|---|---|---|---|---|---|---|---|
| ACT | ACTa | H | H | L | L | BA0 | BA1 | BA2 | BA3 | RE1 |
| | | L | R12 | R13 | R14 | R15 | R16 | R17 | (SPL) | RE2 |
| | ACTb | H | R6 | R7 | R8 | R9 | R10 | R11 | V | RE3 |
| | | L | R0 | R1 | R2 | R3 | R4 | R5 | V | RE4 |
| RD | | H | L | L | L | BA0 | BA1 | BA2 | BA3 | RE1 |
| | | L | C4 | C5 | C6 | C7 | C8 | C9 | BL | RE2 |
| WR | | H | L | L | H | BA0 | BA1 | BA2 | BA3 | RE1 |
| | | L | C4 | C5 | C6 | C7 | C8 | C9 | BL | RE2 |
| MRW | MRWa | H | H | H | H | L | H | V | V | RE1 |
| | | L | MA0 | MA1 | MA2 | MA3 | MA4 | MA5 | (SPL) | RE2 |
| | MRWb | H | V | V | V | V | OP6 | OP7 | V | RE3 |
| | | L | OP0 | OP1 | OP2 | OP3 | OP4 | OP5 | V | RE4 |

FIG. 11

| | COMMAND | CS | CA0 | CA1 | CA2 | CA3 | CA4 | CA5 | CA6 | CA7 | CA8 | CK EDGE |
|---|---|---|---|---|---|---|---|---|---|---|---|---|
| NORMAL MODE | RD | H | L | L | BA0 | BA1 | BA2 | BA3 | AP | V | V | RE1 |
| | | L | C4 | C5 | C6 | C7 | C8 | C9 | BL | V | V | RE2 |
| | WR | H | L | H | BA0 | BA1 | BA2 | BA3 | AP | V | V | RE1 |
| | | L | C4 | C5 | C6 | C7 | C8 | C9 | BL | V | V | RE2 |
| | ACT | H | H | L | V | V | V | V | V | V | R16 | RE1 |
| | | L | V | V | V | V | V | V | V | R14 | R15 | RE2 |
| | | H | R5 | R6 | R7 | R8 | R9 | R10 | R11 | R12 | R13 | RE3 |
| | | L | BA0 | BA1 | BA2 | BA3 | R0 | R1 | R2 | R3 | R4 | RE4 |
| MIXED MODE | ACT-RD | H | L | L | BA0 | BA1 | BA2 | BA3 | AP | H | R16 | RE1 |
| | | L | C4 | C5 | C6 | C7 | C8 | C9 | BL | R14 | R15 | RE2 |
| | | H | R5 | R6 | R7 | R8 | R9 | R10 | R11 | R12 | R13 | RE3 |
| | | L | BA0 | BA1 | BA2 | BA3 | R0 | R1 | R2 | R3 | R4 | RE4 |
| | ACT-WR | H | L | H | BA0 | BA1 | BA2 | BA3 | AP | H | R16 | RE1 |
| | | L | C4 | C5 | C6 | C7 | C8 | C9 | BL | R14 | R15 | RE2 |
| | | H | R5 | R6 | R7 | R8 | R9 | R10 | R11 | R12 | R13 | RE3 |
| | | L | BA0 | BA1 | BA2 | BA3 | R0 | R1 | R2 | R3 | R4 | RE4 |

DYNAMIC RANDOM ACCESS MEMORY (DRAM) DEVICE AND MEMORY CONTROLLER THEREFOR

CROSS-REFERENCE TO RELATED APPLICATIONS

This is a continuation application based on pending application Ser. No. 17/387,036, filed on Jul. 28, 2021, which in turn is a continuation of application Ser. No. 16/874,916, filed on May 15, 2020, now U.S. Pat. No. 11,081,152 B2, issued on Aug. 3, 2021, which in turn is a continuation of application Ser. No. 16/717,742, filed on Dec. 17, 2019, now U.S. Pat. No. 10,930,330 B2, issued on Feb. 23, 2021, which in turn is a continuation of application Ser. No. 16/169,178, filed on Oct. 24, 2018, now U.S. Pat. No. 10,579,263 B2, issued on Mar. 3, 2020, which in turn is a continuation of application Ser. No. 15/690,379, filed on Aug. 30, 2017, now U.S. Pat. No. 10,114,548 B2, issued on Oct. 30, 2018, which in turn is a continuation of application Ser. No. 15/180,175, filed on Jun. 13, 2016, now U.S. Pat. No. 9,754,649 B2, issued on Sep. 5, 2017, the entire contents of all being hereby incorporated by reference.

Korean Patent Application No. 10-2015-0126786, filed on Sep. 8, 2015, and entitled, "Memory System," is incorporated by reference herein in its entirety.

BACKGROUND

1. Field

One or more embodiments described herein relate to a memory system.

2. Description of the Related Art

Efforts are continually being made to reduce the size and number of input/output pads of memory devices. At the same time, attempts are being made to increase capacity and operation speed in order to enhance performance.

Reducing the number of input/output pads of a memory device may involve decreasing the number of pads for receiving commands. The commands may include, for example, addresses. As memory capacity increases, the number of pads (e.g., address pads) may decrease, while the number of bits of the address may increase. Thus, commands may be transferred over a plurality of clock cycles.

When a command is transferred over a plurality of clock cycles, the time duration for transferring the command through a corresponding command pad may exceed the time duration for transferring data through data pads. This may cause inefficiencies or otherwise may disrupt performance.

SUMMARY

In accordance with one or more embodiments, a memory system includes a memory controller to selectively operate in a first mode and a second mode, the memory controller to transmit a first command continuously during a plurality of clock cycles in the first mode and the memory controller to mix a second command with the first command and transmit the mixture of the first command and the second command in the second mode; and a memory to change command latch timing depending on the first mode or the second mode. The memory controller may insert the second command between the clock cycles of the first command in the second mode. The memory may receive flag information representing whether the second command is inserted between the clock cycles of the first command. When the flag information represents that the second command is inserted between the clock cycles of the first command, the memory may latch a second portion of the first command after a standby time from a time point of latching a first portion of the first command. The standby time may be determined based on mode register information provided from the memory controller and is to be stored in a mode register of the memory device. The memory controller may generate the first command including the flag information.

The memory controller may combine the first command and the second command as a third command to transmit the third command in the second mode. The third command may include a row address and a column address. The first command may be an active command including a row address, and the second command may be a column address strobe (CAS) command including a column address.

The memory controller may transmit the active command during 4 clock cycles and transmit the CAS command during 2 clock cycles after transmitting the active command in the first mode; and transmit a first portion of the active command during 2 clock cycles, transmit the CAS command during 2 clock cycles after transmitting the first portion of the active command, and transmit a second portion of the active command after transmitting the CAS command in the second mode. The memory controller may transmit the active command during 4 clock cycles and transmit the CAS command during 2 clock cycles after transmitting the active command in the first mode; and combine the first command and the second command as a third command and transmit the third command during 4 clock cycles in the second mode. A data transfer time for a single access operation may be substantially equal to a CAS-to-CAS delay time (tCCD) between two sequential CAS commands for two sequential access operations.

When a first access operation and a second access operation are performed successively, the memory controller may transmit a first active command for the first access operation; may transmit a first portion of a second active command for the second access operation after transmitting the first active command; may transmit a first CAS command for the first access operation after transmitting the first portion of the second active command; may transmit a second portion of the second active command after transmitting the first CAS command; and may transmit a second CAS command for the second access operation after transmitting the second portion of the second active command. The memory device may be a three-dimensional semiconductor memory device including a plurality of semiconductor dies that are stacked vertically.

In accordance with one or more other embodiments, a memory system includes a memory controller to selectively operate in a first mode and a second mode, the memory controller to transmit an active command including a row address continuously during a plurality of clock cycles in the first mode and the memory controller to mix a column address strobe (CAS) command including a column address with the active command and transmit a mixture of the active command and the CAS command in the second mode; and a memory device to change command latch timing depending on the first mode or the second mode.

In accordance with one or more other embodiments, an apparatus includes an interface coupled to a memory; and a memory controller to selectively operate in a first mode and a second mode, the memory controller to transmit a first command continuously through the interface during a plurality of clock cycles in the first mode and to mix a second command with the first command and transmit the mixture of the first command and the second command through the interface in the second mode. The memory controller may insert the second command between the clock cycles of the first command in the second mode. The memory controller may include flag information in the first command transmitted through the interface to the memory, wherein the flag information is indicative of a change in command latch timing for the memory.

BRIEF DESCRIPTION OF THE DRAWINGS

Features will become apparent to those of skill in the art by describing in detail exemplary embodiments with reference to the attached drawings in which:

FIG. 4 illustrates an example of commands for a memory system;

FIG. 11 illustrates an example of commands for a memory system;

DETAILED DESCRIPTION

Figure 1:
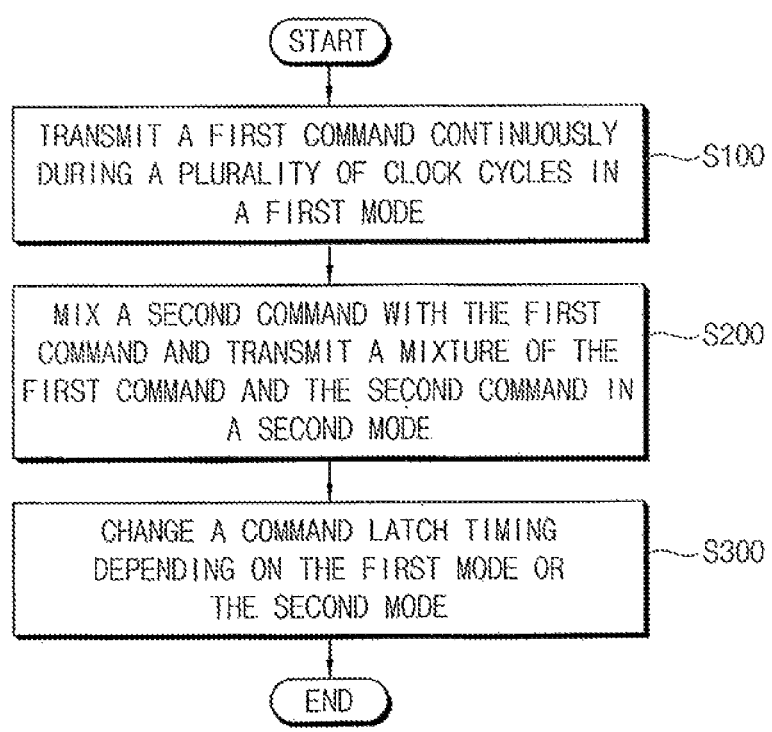
FIG. 1 illustrates an embodiment of a method for operating a memory system.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it may be directly on the other layer or substrate, or intervening layers may also be present. Further, it will be understood that when a layer is referred to as being "under" another layer, it may be directly under, and one or more intervening layers may also be present. In addition, it will also be understood that when a layer is referred to as being "between" two layers, it may be the only layer between the two layers, or one or more intervening layers may also be present. Like reference numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates an embodiment of a method for operating a memory system. Referring to FIG. 1, in a first mode, a first command is continuously transferred from a memory controller and a memory device during a plurality of clock cycles (S100). In a second mode, a second command is mixed with the first command and the mixture of the first command and the second command is transferred from the memory controller to the memory device (S200).

The first command may be, for example, an active command including a row address. The second command may include, for example, a column address strobe (CAS) command including a column address. The CAS command may be a read command indicating a read operation or a write command indicating a write operation. In one embodiment, the memory device may perform row addressing based on the row address provided with or in the active command, and then may perform column addressing based on the column address provided with or in the CAS command. The first mode may correspond to an operation mode in which a plurality of commands for a single operation are transferred sequentially, in a predetermined order, from the memory controller to the memory device.

The second mode may correspond to an operation mode in which the first command and the second command are mixed. The mixed results are then transferred from the memory controller to the memory device. In some example embodiments, as described, for example, with reference to FIGS. 6 to 10, the memory controller may insert the second command between the clock cycles of the first command in the second mode. In other example embodiments, as described, for example, with reference to FIGS. 11 to 13, the memory controller may combine the first command and the second command as a third command and transmit the third command in the second mode.

Figure 7:
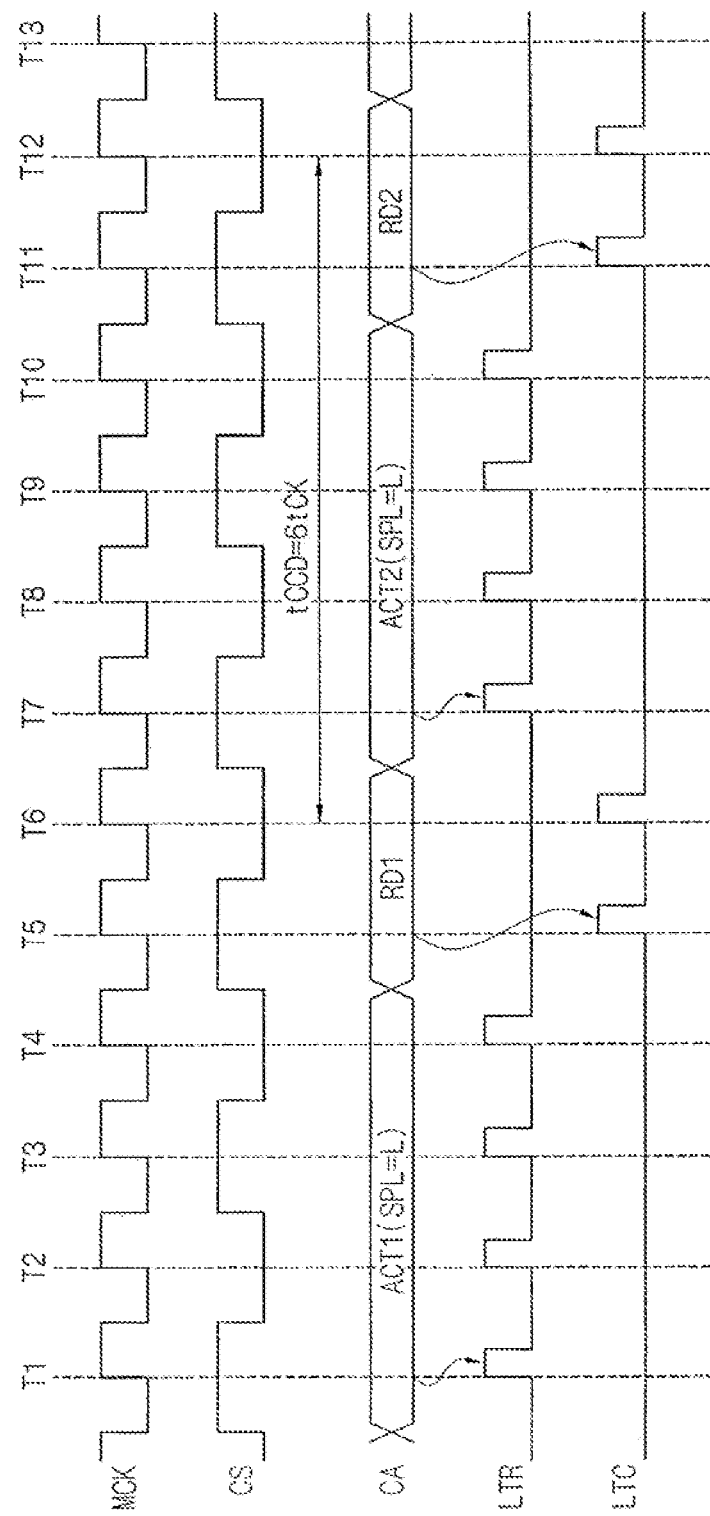
FIGS. 7 and 8 illustrate an example of signal transfer and command latch timing in a first mode.
Figure 8:
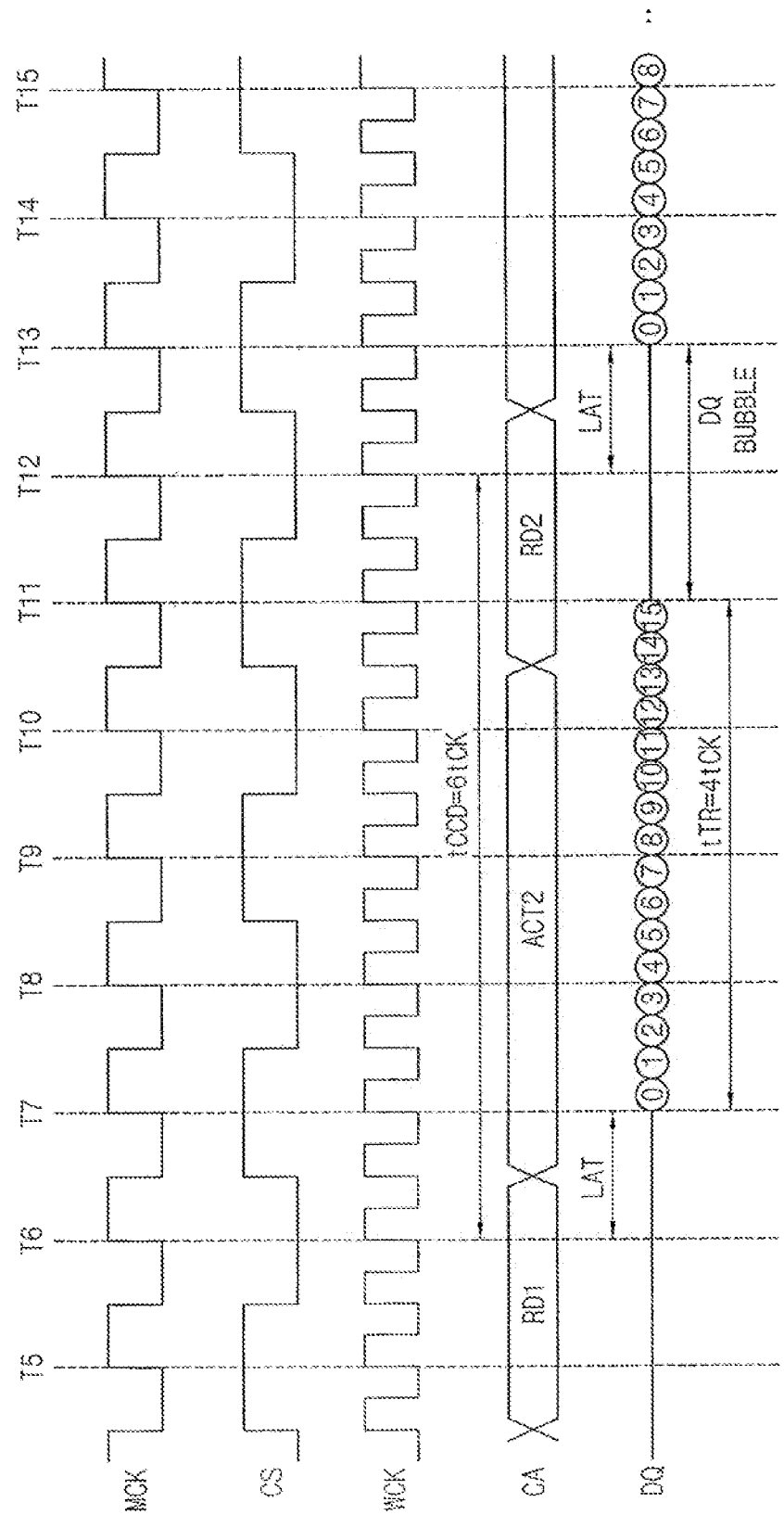
Figure 9:
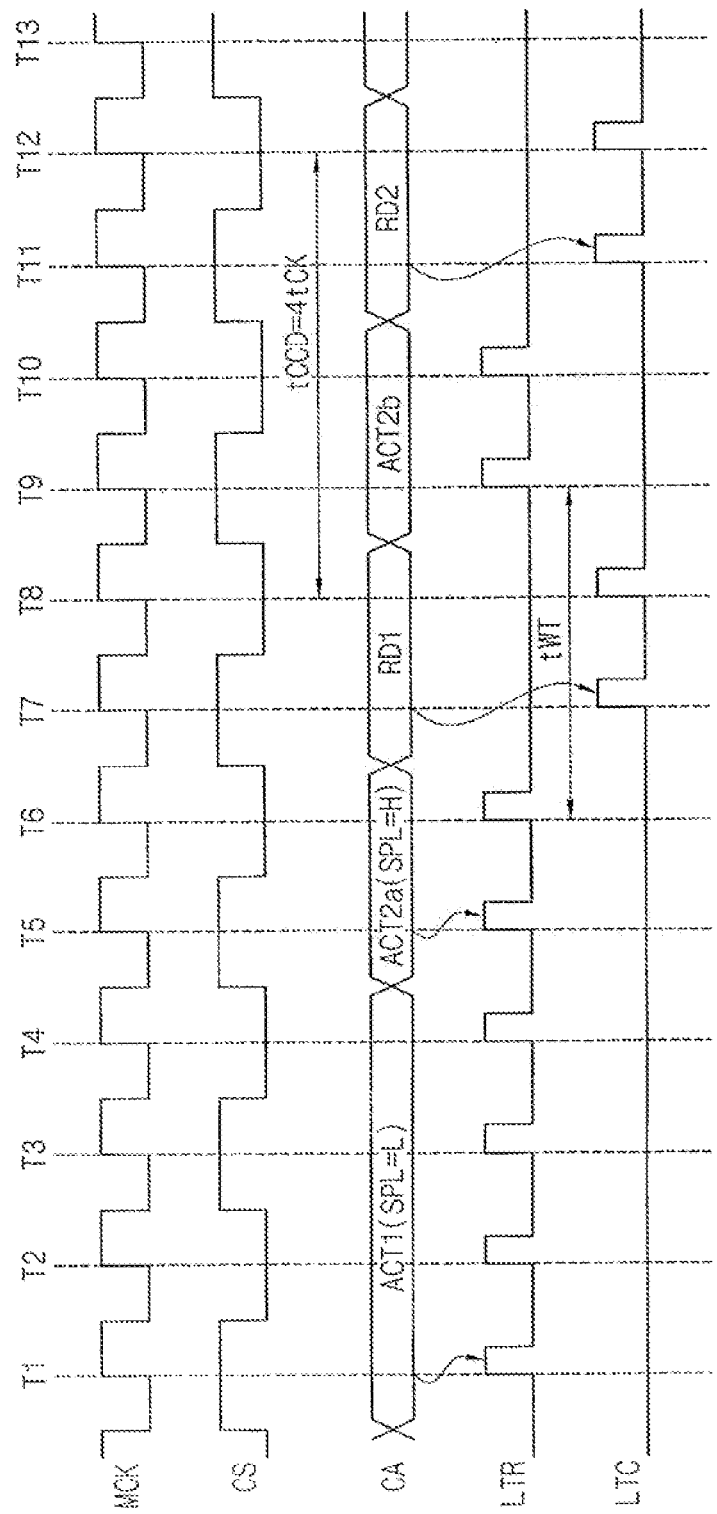
FIGS. 9 and 10 illustrate examples of signal transfer and command latch timing in a second mode.

In the memory device, command latch timing may be changed depending on the first mode or the second mode (S300). For example, the memory device may receive flag information representing whether the second command is inserted between the clock cycles of the first command. In some example embodiments, as described, for example, with reference to FIG. 4, the memory controller may incorporate the flag information into the first command and may provide the first command including the flag information to the memory device. The memory device may change the command latch timing depending on the first mode or the second mode based on the flag information in the first command. The change of the command latch timing may be performed, for example, as indicated in FIGS. 7 to 9.

The memory system and the method of operating the memory system according to example embodiments may reduce the tCCD by adopting the second mode for mixing the two commands. Through the reduction of the tCCD, the DQ bubble, in which data transfer is not performed continuously, may be prevented and utilization of the data bus may be enhanced.

Figure 2:
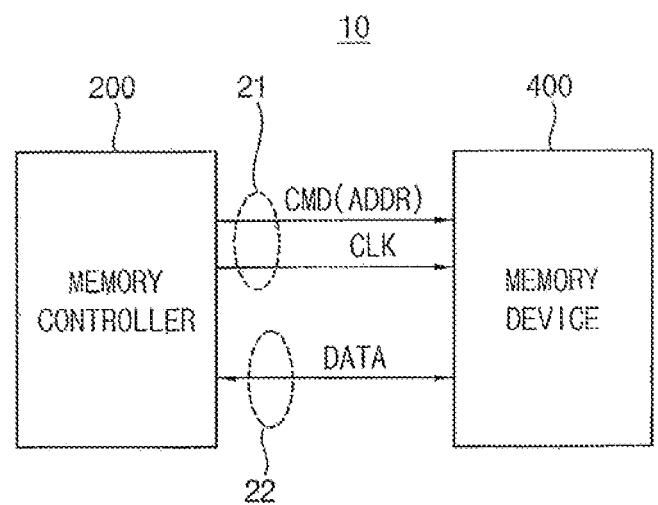
FIG. 2 illustrates an embodiment of a memory system.
Figure 3:
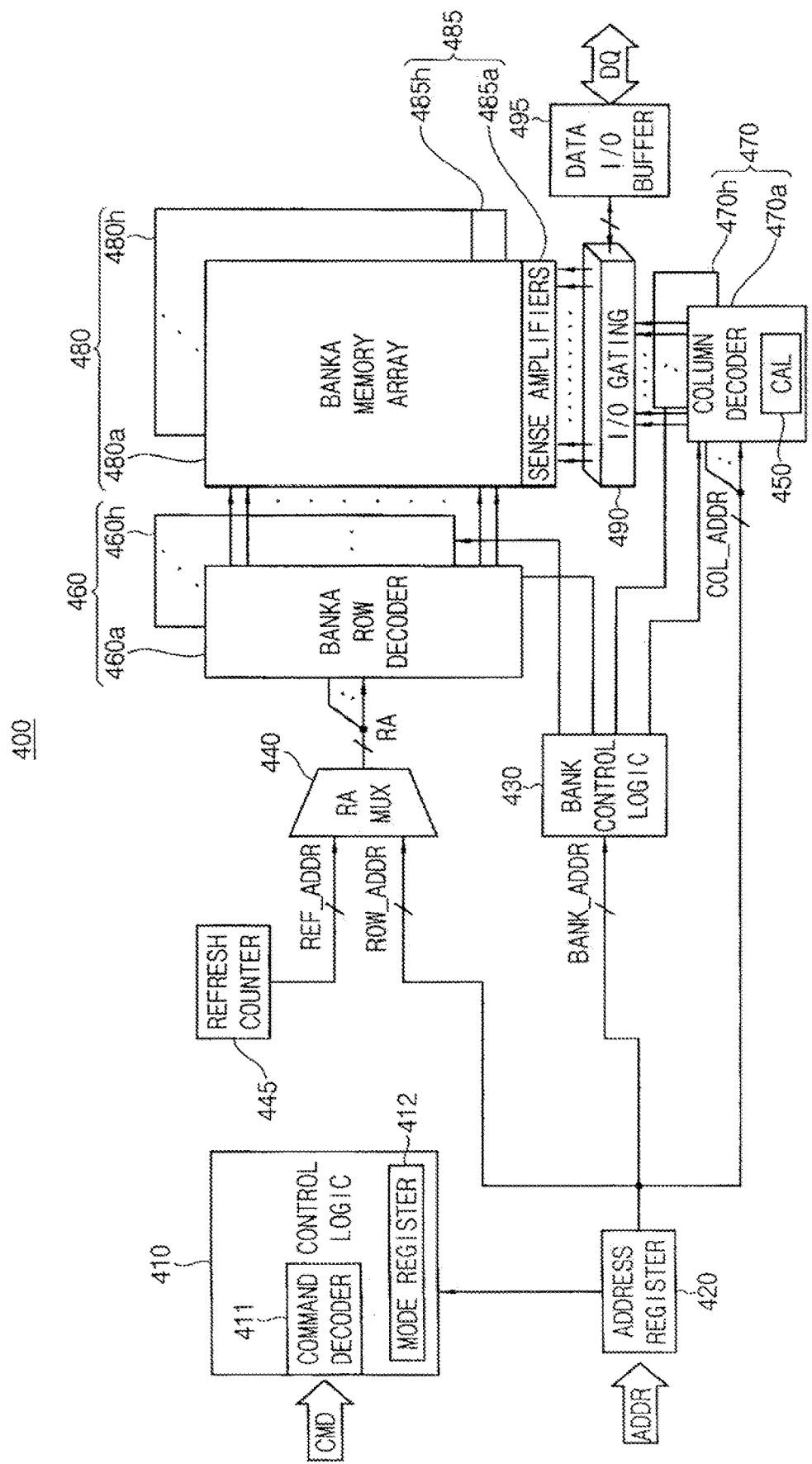
FIG. 3 illustrates an embodiment of a memory device.

FIG. 2 illustrates an embodiment of a memory system 10, and FIG. 3 illustrates an embodiment of a memory device 400 in the memory system 10 of FIG. 2. Referring to FIG. 2, the memory system 10 includes a memory controller 200 and a memory device 400. The memory controller 200 and the memory device 400 includes respective interfaces for mutual communication. The interfaces may be connected through a control bus 21 for transferring a command CMD, an address ADDR, a clock signal CLK, etc. and a data bus 22 for transferring data.

According to some standards for memory devices, the address ADDR may be incorporated in the command CMD as illustrated in FIG. 4. The memory controller 200 may generate the command CMD to control the memory device 400 and the data may be written in or read from the memory device 400 under the control of the memory controller 200. According to example embodiments, the memory controller 200 may selectively operate in a first mode to transmit a first command continuously during a plurality of clock cycles or a second mode to mix a second command with the first command, and transmit a mixture of the first command and the second command. The memory device 400 may change command latch timing depending on the first mode or the second mode.

Referring to FIG. 3, the memory device 400 may include a control logic 410, an address register 420, a bank control logic 430, a row address multiplexer 440, a refresh counter 445, a column address latch 450, a row decoder 460, a column decoder 470, a memory cell array 480, a sense amplifier unit 485, an input/output (I/O) gating circuit 490 and a data input/output (I/O) buffer 495.

The memory cell array 480 may include a plurality of bank arrays 480a~480h. The row decoder 460 may include a plurality of bank row decoders 460a~460h respectively coupled to the bank arrays 480a~480h. The column decoder 470 may include a plurality of bank column decoders 470a~470h respectively coupled to the bank arrays 480a~480h. The sense amplifier unit 485 may include a plurality of bank sense amplifiers 485a~485h respectively coupled to the bank arrays 480a~480h.

The address register 420 may receive an address ADDR including a bank address BANK_ADDR, a row address ROW_ADDR, and a column address COL_ADDR from the memory controller. The address register 420 may provide the received bank address BANK_ADDR to the bank control logic 430, the received row address ROW_ADDR to the row address multiplexer 440, and the received column address COL_ADDR to the column address latch 450.

The bank control logic 430 may generate bank control signals based on the bank address BANK_ADDR. One of the bank row decoders 460a~460h corresponding to the bank address BANK_ADDR may be activated based on the bank control signals. One of the bank column decoders 470a~470h corresponding to the bank address BANK_ADDR may be activated based on the bank control signals.

The row address multiplexer 440 may receive the row address ROW_ADDR from the address register 420 and may receive a refresh row address REF_ADDR from the refresh counter 445. The row address multiplexer 440 may selectively output the row address ROW_ADDR or the refresh row address REF_ADDR as a row address RA. The row address RA output from the row address multiplexer 440 may be applied to the bank row decoders 460a~460h.

The activated one of the bank row decoders 460a~460h may decode the row address RA output from the row address multiplexer 440 and may activate a word-line corresponding to the row address RA. For example, the activated bank row decoder may apply a word-line driving voltage to the word-line corresponding to the row address RA.

The column decoder 470 may include a column address latch (CAL) 450. The column address latch may receive the column address COL_ADDR from the address register 420 and temporarily store the received column address COL_ADDR. In some embodiments, in a burst mode, the column address latch 450 may generate column addresses that increment from the received column address COL_ADDR. The column address latch 450 may apply the temporarily stored or generated column address to the bank column decoders 470a~470h.

The activated one of the bank column decoders 470a~470h may decode the column address COL_ADDR output from the column address latch 450 and may control the I/O gating circuit 490 in order to output data corresponding to the column address COL_ADDR.

The I/O gating circuit 490 may include circuitry for gating input/output data. The I/O gating circuit 490 may further include read data latches for storing data output from the bank arrays 480a~480h and write drivers for writing data to the bank arrays 480a~480h.

Data to be read from one bank array of the bank arrays 480a~480h may be sensed by a sense amplifier unit 485 coupled to the one bank array from which the data is to be read and may be stored in the read data latches. The data stored in the read data latches may be provided to the memory controller via the data I/O buffer 495. Data DQ to be written in one bank array of the bank arrays 480a~480h may be provided to the data I/O buffer 495 from the memory controller. The write driver may write the data DQ in one bank array of the bank arrays 480a~480h.

The control logic 410 may control operations of the memory device 400. For example, the control logic 410 may generate control signals for the memory device 400 in order to perform a write operation or a read operation. The control logic 410 may include a command decoder 411 that decodes a command CMD received from the memory controller 200 and a mode register set 412 that sets an operation mode of the memory device.

In some example embodiments, the control logic 410 may generate latch control signals LTR and LTC, for example, as illustrated in FIGS. 7 and 9, to control operation of the address register 420. The control logic may generate the latch control signals LTR and LTC based on the flag information representing whether the second command is inserted between the clock cycles of the first command.

FIG. 3 illustrates that the control logic 410 and the address register 420 are distinct from each other. In another embodiment, the control logic 410 and the address register 420 may be implemented as a single inseparable circuit. In addition, FIG. 3 illustrates that the command CMD and the address ADDR are provided as distinct signals. In another embodiment, the command CMD and the address ADDR may be provided as combined signals, for example, as illustrated in FIG. 4.

FIG. 4 illustrates example commands which may be used in one embodiment of a memory system. In this embodiment, combinations of the chip selection signal CS and the command-address signals CA0~CA6 representing an active command ACT, a read command RD, a write command WR and a mode register write command MRW. Also, H indicates the logic high level, L indicates the logic low level, R0~R17 indicate bits of a row address RA, BA0~BA3 indicate bits of a bank address BA, V indicates any one of the logic low level and the logic high level, BL indicates a burst length, C4~C9 indicate bits of a column address CA, MA0~MA5 indicate a location of the mode register in which the mode register write operation is performed, OP0~OP7 indicate the mode information to be written in the mode register, and RE1~RE4 indicate first through fourth rising edges of a clock signal CK.

The active command ACT may include a first portion ACTa and a second portion ACTb and the active command ACT may be transferred during a plurality of clock cycles, for example, during the four clock cycles as illustrated in FIG. 4. The active command ACT may include the bank address bits BA0~BA3 and the row address bits R0~R17. Also the active command ACT may include the flag information SPL representing whether the other command is inserted between the clock cycles of the active command ACT. The first logic level (e.g., logic low level L) of the flag information SPL may indicate the first mode or the normal mode in which the first portion ACTa and the second portion ACTb of the active command ACT are transferred continuously during a plurality of clock cycles. The second logic level (e.g., logic high level H) of the flag information SPL may indicate the second mode or the split mode in which the other command is inserted between the first portion ACTa and the second portion ACTb of the active command ACT and the mixture of the active command ACT and the other command is transferred.

Each of the read command RD and the write command WR may include the bank address bits BA0~BA3 and the column address bits C4~C9 and may be transferred during a plurality of clock cycles, for example, during the two clock cycles as in FIG. 4.

The mode register write command MRW may include a first portion MRWa and a second portion MRWb. The mode register write command MRW may be transferred during a plurality of clock cycles, for example, during the four clock cycles as illustrated in FIG. 4. The mode register write command MRW may include the mode register location bits MA0~MA5 and the mode information bits OP0~OP7. Also, the mode register write command MRW may include the flag information SPL representing whether the other command is inserted between the clock cycles of the mode register write command MRW.

The first logic level (e.g., logic low level L) of the flag information SPL may indicate the first mode or the normal mode in which the first portion MRWa and the second portion MRWb of the mode register write command MRW are transferred continuously during a plurality of clock cycles. The second logic level (e.g., logic high level H) of the flag information SPL may indicate the second mode or the split mode in which the other command is inserted between the first portion MRWa and the second portion MRWb of the mode register write command MRW and the mixture of the mode register write command MRW and the other command is transferred.

FIG. 4 illustrates non-limiting examples of combinations of the chip selection signal CS and the command-address signals CA0~CA6. In at least one embodiment, combinations of signals representing the commands may be changed in various ways.

Figure 5:
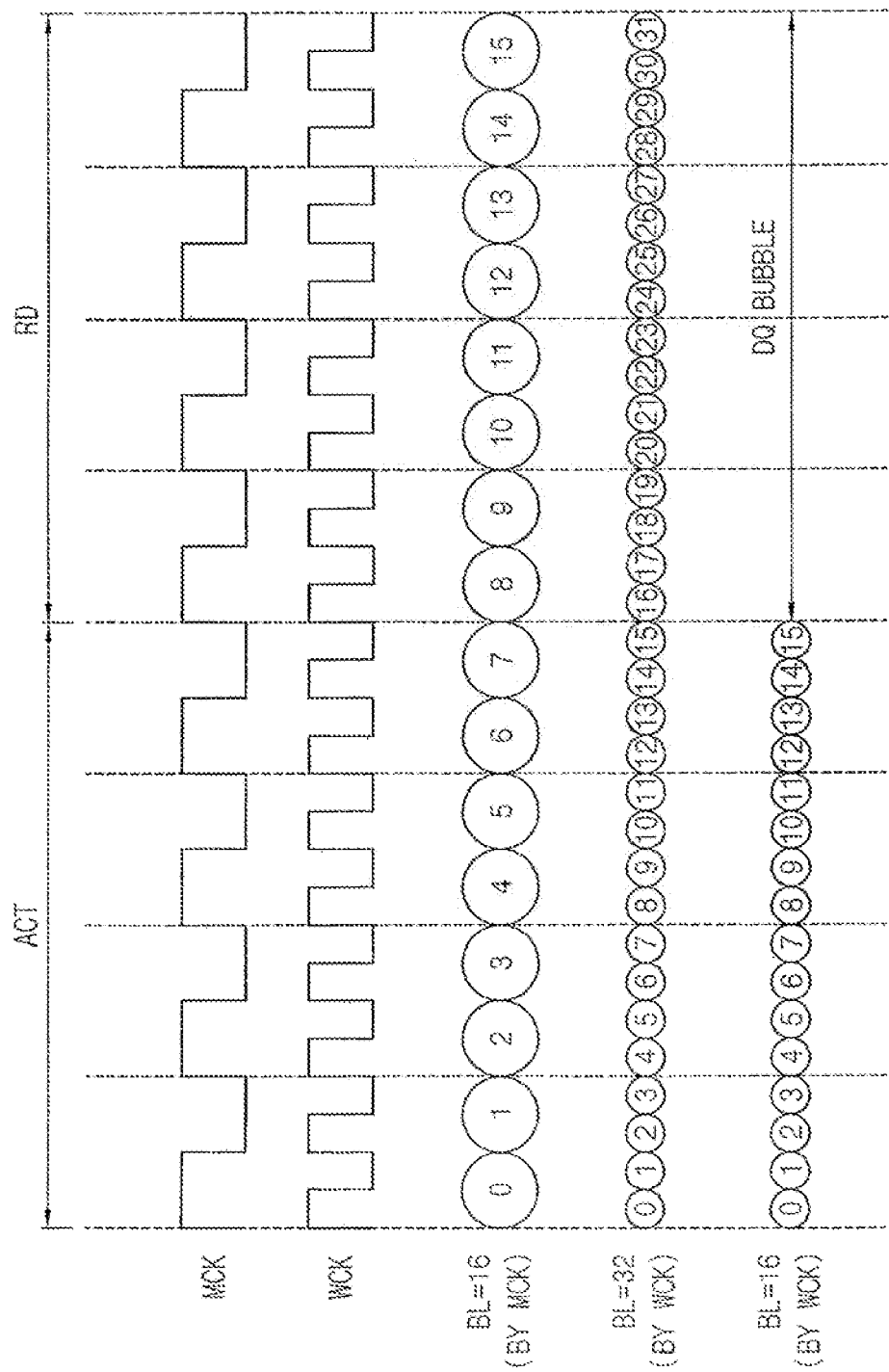
FIG. 5 illustrates an example of date transfer and command transfer times.

FIG. 5 illustrating a timing diagram describing an example of a data transfer time and a command transfer time. Referring to FIG. 5, the commands ACT and RD may be transferred in synchronization with a main clock signal MCK of a memory system. For example, the transfer time of the active command ACT may correspond to the four clock cycles of the main clock signal MCK and the transfer time of the read command RD may correspond to the four clock cycles of the main clock signal MCK. As such, the transfer time of the commands ACT and RD for the read operation may correspond to the eight clock cycles of the main clock signal MCK.

The data transfer time may be changed depending on the clock frequency for the data transfer, the burst length BL, etc. For example, the data bits 0~31 may be transferred in synchronization with the main clock signal MCK or the data clock signal WCK having a doubled frequency according to the configuration of the memory system.

When the burst length BL is 16 and the data transfer is synchronized with the main clock signal MCK, the 16 data bits 0~16 may be transferred during the 8 clock cycles of the main clock signal MCK. Thus, the data transfer time may be equal to the command transfer time. When the burst length BL is 32 and the data transfer is synchronized with the data clock signal WCK, the 32 data bits 0~31 may be transferred during the 8 clock cycles of the main clock signal MCK. Thus, the data transfer time may be equal to the command transfer time. When the burst length BL is 16 and the data transfer is synchronized with the data clock signal WCK, the 16 data bits 0~16 may be transferred during the 4 clock cycles of the main clock signal MCK. Thus, the data transfer time may be shorter than the command transfer time.

The problem of utilization of the data bus may not be caused when the data transfer time is equal to the command transfer time. However, the problem of DQ bubble may be caused such that the data transfer may not be performed continuously when the data transfer time is shorter than the command transfer time.

Figure 6:
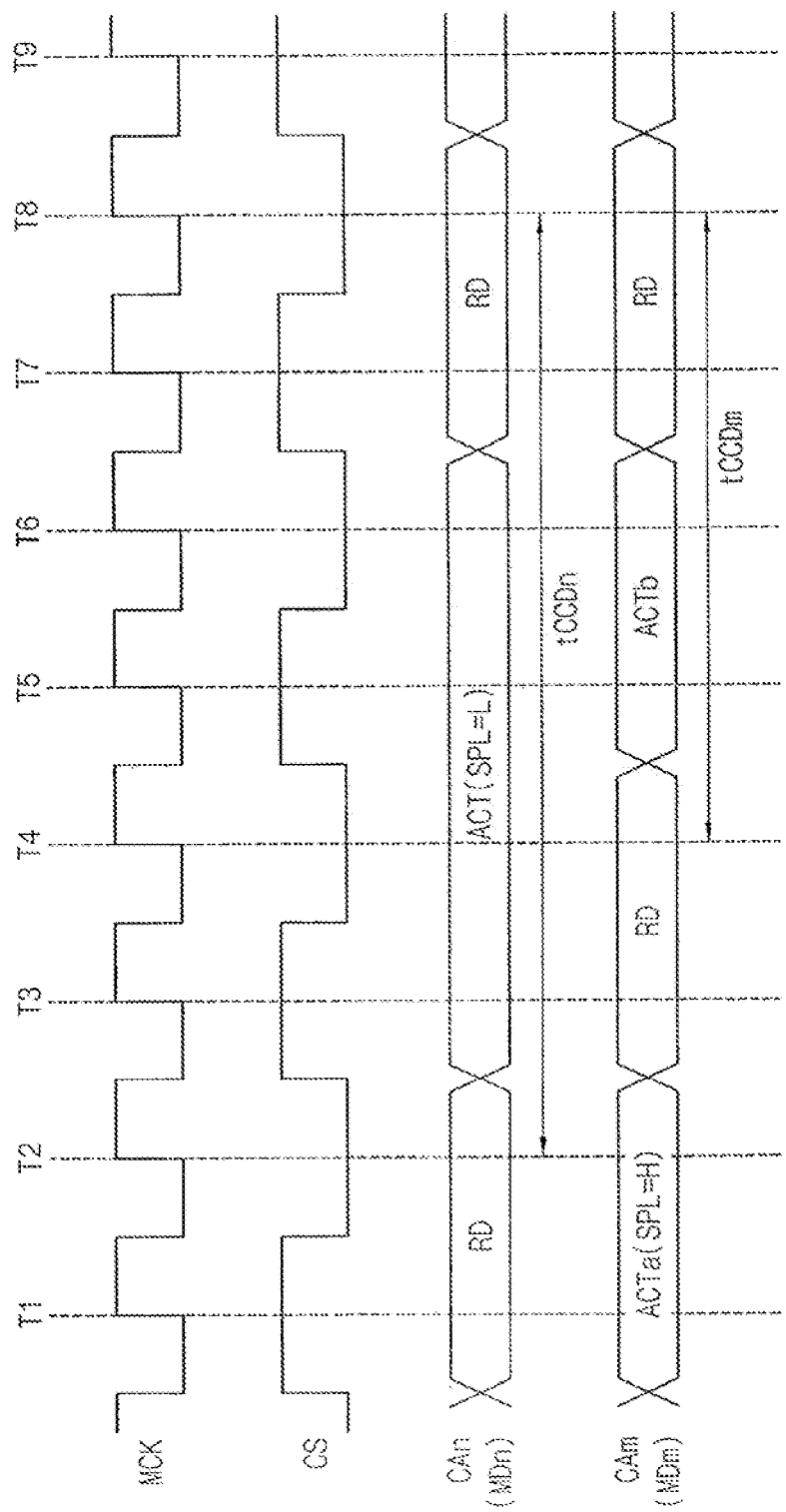
FIG. 6 illustrates example operations in different modes of the memory system.

FIG. 6 illustrates a timing diagram of example operations in a first mode and a second mode. Referring to FIG. 6, the command may be determined as the combination of the chip selection signal CS and the command-address signals CA at the rising edges T1~T9 of the main clock signal MCK. The examples of the combination of the chip selection signal CS and the command-address signals CA are illustrated in FIG.

4. FIG. 6 illustrates the command-address signals CAn in the first mode and the command-address signals CAm in the second mode.

The first command may be transferred continuously during a plurality of clock cycles in the first mode. The mixture of the first command and the second command may be transferred in the second mode. As illustrated in FIG. 6, the first command may be the active command ACT and the second command may be the CAS command. FIG. 6 illustrates the read command RD as an example of the CAS command and the CAS command may be the write command WR.

The memory controller 200 in FIG. 2 may transmit the active command ACT during the four clock cycles corresponding to the four rising edges T3, T4, T5, and T6 of the main clock signal MCK. The memory controller 200 may then transmit the CAS command RD during the two clock cycles corresponding to the two rising edges T7 and T8 in the first mode. The flag information SPL in the active command ACT may be at logic low level L.

In contrast, the memory controller 200 may transmit the first portion ACTa of the active command ACT during the two clock cycles corresponding to the two rising edges T1 and T2. The memory controller 200 may transmit the CAS command RD during the two clock cycles corresponding to the two rising edges T3 and T4. The memory controller 200 may then transmit the second portion ACTb of the active command ACT during the two clock cycles corresponding to the two rising edges T5 and T6 in the second mode. The flag information SPL in the first portion ACTa of the active command ACT may be at logic high level H.

As illustrated in FIG. 6, the CAS-to-CAS delay time (tCCD) corresponding to the time duration between the two successive CAS commands may be reduced by adopting the second mode for mixing the two commands. The tCCDn in the first mode corresponds to the 6 clock cycles but the tCCDm in the second mode may be reduced to the 4 clock cycles. Through the reduction of the tCCD, the DQ bubble, in which data transfer is not performed continuously, may be prevented and utilization of the data bus may be enhanced.

FIGS. 7 and 8 are timing diagrams illustrating an example of a signal transfer and a command latch timing in a first mode. In particular, FIG. 7 illustrates command transfer and command latch timing in the first mode or the normal mode when a first access operation and a second access operation are performed successively. FIG. 8 illustrates corresponding data transfer. As described above, the command may be determined as the combination of the chip selection signal CS and the command-address signals CA at the rising edges T1~T15 of the main clock signal MCK.

Referring to FIG. 7, a first active command ACT1 and a first CAS command RD1 for a first access operation may be transferred sequentially and then a second active command ACT2 and a second CAS command RD2 for a second access operation may be transferred sequentially. FIG. 7 illustrates the read command RD as an example of the CAS command and the CAS command may be the write command WR.

In the first mode, the memory controller 200 in FIG. 2 may transmit the first active command ACT1 during the 4 clock cycles corresponding to the 4 rising edges T1, T2, T3, and T4 of the main clock signal MCK, transmit the first CAS command RD1 during the 2 clock cycles corresponding to the 2 rising edges T5 and T6 after transmitting the first active command ACT1, transmit the second active command ACT2 during the 4 clock cycles corresponding to the 4 rising edges T7, T8, T9, and T10 after transmitting the first CAS command RD1, and then transmit the second CAS command RD2 during the 2 clock cycles corresponding to the 2 rising edges T11 and T12 after transmitting the second active command ACT2. In this case, the flag information SPL in the first active command ACT1 and the second active command ACT2 may be at a first logic level (e.g., logic low level L) to indicate the first mode. As a result, the tCCD between the two consecutive CAS commands RD1 and RD2 may correspond to the 6 clock cycles 6tCK.

The control logic 410 in the memory device 400 of FIG. 3 may generate a row latch control signal LTR and a column latch control signal LTC and provide them to the address register 420. The address register 420 may latch the row addresses in the active commands ACT1 and ACT2 in response to the row latch control signal LTR. The address register 420 may latch the column addresses in the CAS commands RD1 and RD2 in response to the column latch control signal LTC. For example, as illustrated in FIG. 7, the control logic 410 may activate the row latch control signal LTR in a form of 4 pulses when the active command ACT corresponding to the 4 clock cycles is received. The control logic 410 may activate the column latch control signal LTC in a form of 2 pulses when the CAS command RD corresponding to the 2 clock cycles is received.

The control logic 410 may control the activation timing of the row latch control signal LTR based on the flag information SPL representing whether the CAS command is inserted between the clock cycles of the active command ACT. The control logic 410 may activate the row latch control signal LTR in synchronization with the 4 consecutive rising edges T1, T2, T3, and T4 when the flag information in the first active command ACT1 is the logic low level L to indicate the first mode. Also, the control logic 410 may activate the row latch control signal LTR in synchronization with the 4 consecutive rising edges T7, T8, T9, and T10 when the flag information in the second active command ACT2 is a logic low level L to indicate the first mode.

FIG. 8 illustrates an example of data transfer in the first mode performed in synchronization with the data clock signal WCK with the burst length of 16. In this case, the data transfer time tTR for one access operation corresponds to the 4 clock cycles 4tCK of the main clock signal MCK.

Referring to FIG. 8, transfer of the data bits 0~15 may begin through the data bus or the data pin DQ after a predetermined latency LAT from the respective time points T6 and T12 when the CAS commands RD1 and RD2 are received by the memory device through the control bus. The latency LAT may be the read latency when the CAS command is the read command RD and the latency LAT may be the write latency when the CAS command is the write command WR. FIG. 8 illustrates the latency LAT of the one clock cycle for convenience of illustration. The latency LAT may be determined variously depending on the configuration of the memory system and/or type of the access operation.

As illustrated in FIG. 8, the data transfer time tTR for the one access operation may be the four clock cycles 4tCK of the main clock signal MCK and the tCCD between the two consecutive CAS commands RD1 and RD2 may be the 6 clock cycles 6tCK of the main clock signal MCK. As such, a DQ bubble may be caused if the tCCD is longer than the data transfer time tTR. In this case, data transfer for the consecutive access operations may not be performed continuously due to the DQ bubble. The DQ bubble may degrade utilization of the data bus by increasing the enable time of the data clock signal.

Figure 10:
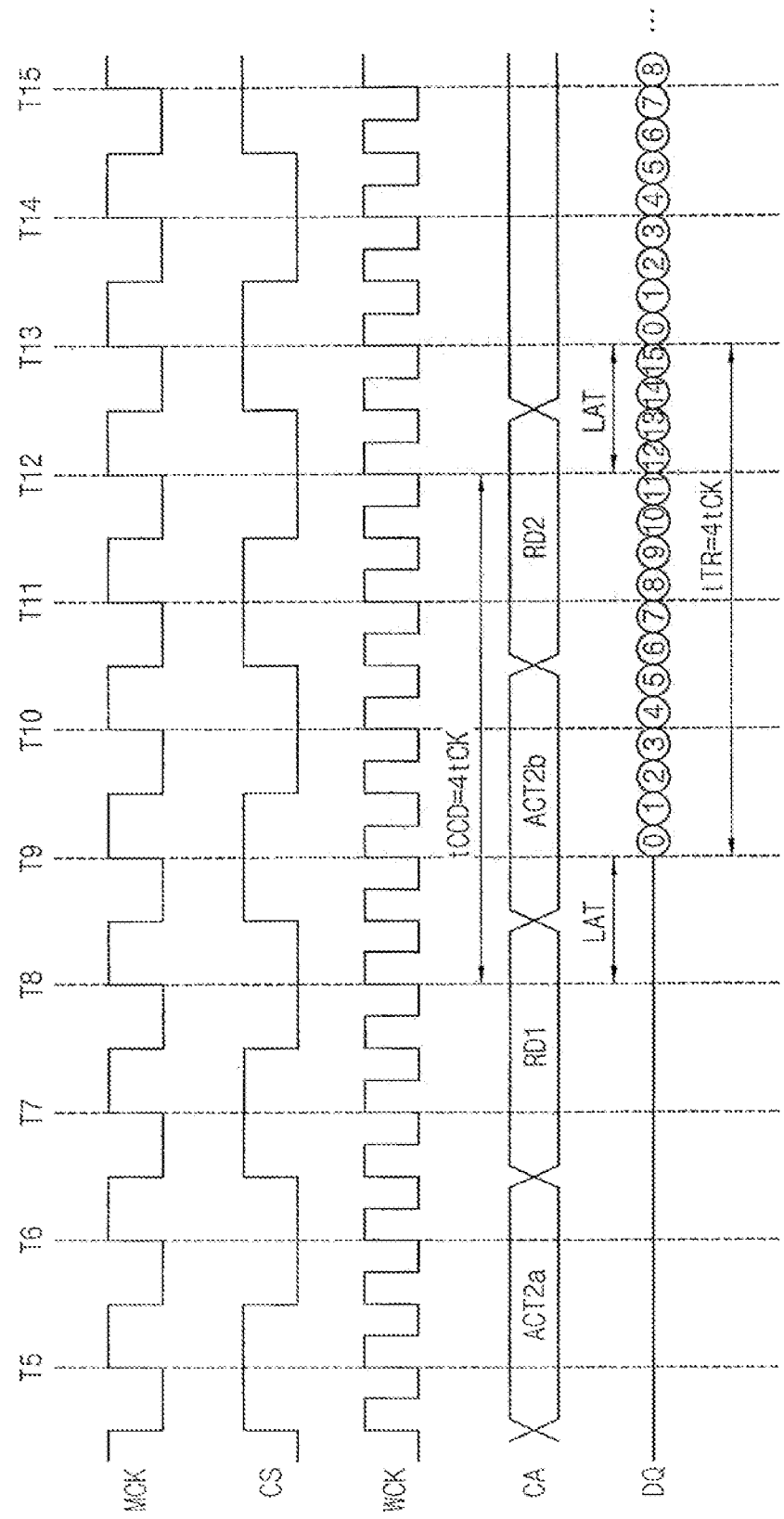

FIGS. 9 and 10 are timing diagrams illustrating an example of a signal transfer and a command latch timing in a second mode. In particular, FIG. 9 illustrates command transfer and command latch timing in the second mode or the mixed mode when a first access operation and a second access operation are performed successively. FIG. 10 illustrates corresponding data transfer. As described above, the command may be determined as the combination of the chip selection signal CS and the command-address signals CA at the rising edges T1~T15 of the main clock signal MCK.

Referring to FIG. 9, a first active command ACT1 and a first CAS command RD1 for a first access operation may be transferred and a second active command ACT2 and a second CAS command RD2 for a second access operation may be transferred. FIG. 9 illustrates the read command RD as an example of the CAS command and the CAS command may be the write command WR.

The memory controller 200 in FIG. 2 may transmit the first active command ACT1 during the 4 clock cycles corresponding to the 4 rising edges T1, T2, T3, and T4 of the main clock signal MCK in the first mode. After transmitting the first active command ACT1, the memory controller 200 may transmit the second active command ACT2 and the first CAS command RD1 in the second mode.

For example, the memory controller 200 may transmit the first portion ACT2$a$ of the second active command ACT2 during the 2 clock cycles corresponding to the 2 rising edges T5 and T6, transmit the first CAS command RD1 during the 2 clock cycles corresponding to the 2 rising edges T7 and T8 after transmitting the first portion ACT2$a$, and transmit the second portion ACT2$b$ of the second active command ACT2 during the 2 clock cycles corresponding to the 2 rising edges T9 and T10. After transmitting the second portion ACT2$b$ of the second active command ACT2, the memory controller 200 may transmit the second CAS command RD2 during the 2 clock cycles corresponding to the 2 rising edges T11 and T12.

In this case, the flag information SPL in the first active command ACT1 may be a first logic level (e.g., logic low level L) to indicate the first mode and the flag information in the second active command ACT2 may be a second logic level (e.g., logic high level H) to indicate the second mode. As a result, the tCCD between the two consecutive CAS commands RD1 and RD2 may correspond to the 4 clock cycles 4tCK.

The control logic 410 in the memory device 400 of FIG. 3 may generate a row latch control signal LTR and a column latch control signal LTC and provide them to the address register 420. The address register 420 may latch the row addresses in the active commands ACT1 and ACT2 in response to the row latch control signal LTR. The address register 420 may latch the column addresses in the CAS commands RD1 and RD2 in response to the column latch control signal LTC.

For example, as illustrated in FIG. 9, the control logic 410 may activate the row latch control signal LTR in a form of 4 pulses when the active command ACT corresponding to the 4 clock cycles is received. The control logic 410 may activate the column latch control signal LTC in a form of 2 pulses when the CAS command RD corresponding to the 2 clock cycles is received. The control logic 410 may control the activation timing of the row latch control signal LTR based on the flag information SPL representing whether the CAS command is inserted between the clock cycles of the active command ACT. The control logic 410 may activate the row latch control signal LTR in synchronization with the 4 consecutive rising edges T1, T2, T3, and T4 when the flag information in the first active command ACT1 is a logic low level to indicate the first mode. In contrast, the control logic 410 may activate the row latch control signal LTR in synchronization with the 4 non-consecutive rising edges T5, T6, T9, and T10 when the flag information in the second active command ACT2 is a logic high level H to indicate the second mode.

The address register 420 in the memory device 400 may latch the second portion ACT2$b$ of the second active command ACT2 after a standby time tWT from a time point T6 of latching the first portion ACT2$a$ of the second active command ACT2 in response to the row latch control signal LTR, when the flag information SPL represents that the other command (e.g., the first CAS command RD1) is inserted between the clock cycles of the second active command ACT2. The standby time tWT may be determined based on mode register information provided from the memory controller 200 and stored in the mode register set 412 in the memory device 400 of FIG. 3. The mode register information may be provided through the mode register write command MRW. The mode register write command MRW may include the information OP0~OP7 as illustrated in FIG. 4 to be written in the mode register set 412.

FIG. 10 illustrates an example of data transfer in the second mode performed in synchronization with the data clock signal WCK with the burst length of 16. In this case, the data transfer time tTR for one access operation corresponds to the 4 clock cycles 4tCK of the main clock signal MCK.

Referring to FIG. 10, transfer of the data bits 0~15 may begin through the data bus or the data pin DQ after a predetermined latency LAT from the respective time points T8 and T12 when the CAS commands RD1 and RD2 are received by the memory device through the control bus. The latency LAT may be the read latency when the CAS command is the read command RD and the latency LAT may be the write latency when the CAS command is the write command WR. FIG. 10 illustrates the latency LAT of the one clock cycle for convenience of illustration and the latency LAT may be determined in various ways depending on configuration of the memory system and/or type of the access operation.

As illustrated in FIG. 10, the data transfer time tTR for the one access operation may be the four clock cycles 4tCK of the main clock signal MCK. The tCCD between the two consecutive CAS commands RD1 and RD2 may be the 4 clock cycles 4tCK of the main clock signal MCK. As such, a DQ bubble, for example, as illustrated in FIG. 8, may be removed if the tCCD is equal to the data transfer time tTR, and the data transfer for the consecutive access operations may be performed continuously.

The memory system and the method of operating the memory system according to example embodiments may therefore reduce the tCCD by adopting the second mode for mixing the two commands. Through the reduction of the tCCD, the DQ bubble, in which data transfer is not performed continuously, may be prevented and utilization of the data bus may be enhanced.

FIG. 11 illustrating another example of commands that may be used in a memory system. In particular, FIG. 11 illustrates combinations of the chip selection signal CS and the command-address signals CA0~CA8 representing an active command ACT, a read command RD and a write command WR in the first mode or the normal mode and an active-read command ACT-RD and an active-write command ACT-WR in the second mode or the mixed mode. Also, H indicates a logic high level, L indicates a logic low level, R0~R16 indicate bits of a row address RA, BA0~BA3 indicate bits of a bank address BA, V indicates any one of the logic low level and the logic high level, AP indicates auto-precharge, BL indicates a burst length, C4~C9 indicate bits of a column address CA, and RE1~RE4 indicate first through fourth rising edges of clock signal CK.

The memory controller 200 in FIG. 2 may combine two commands as a single combined command to transmit the single combined command in the second mode. For example, as illustrated in FIG. 11, the read command RD and the active command ACT in the normal mode may be combined as the active-read command ACT-RD in the mixed mode. The write command WR and the active command ACT in the normal mode may be combined as the active-write command ACT-WR in the mixed mode. Each of the active-read command ACT-RD and the active-write command ACT-WR may include both the row address R0~R16 and the column address C4~C9.

Figure 12:
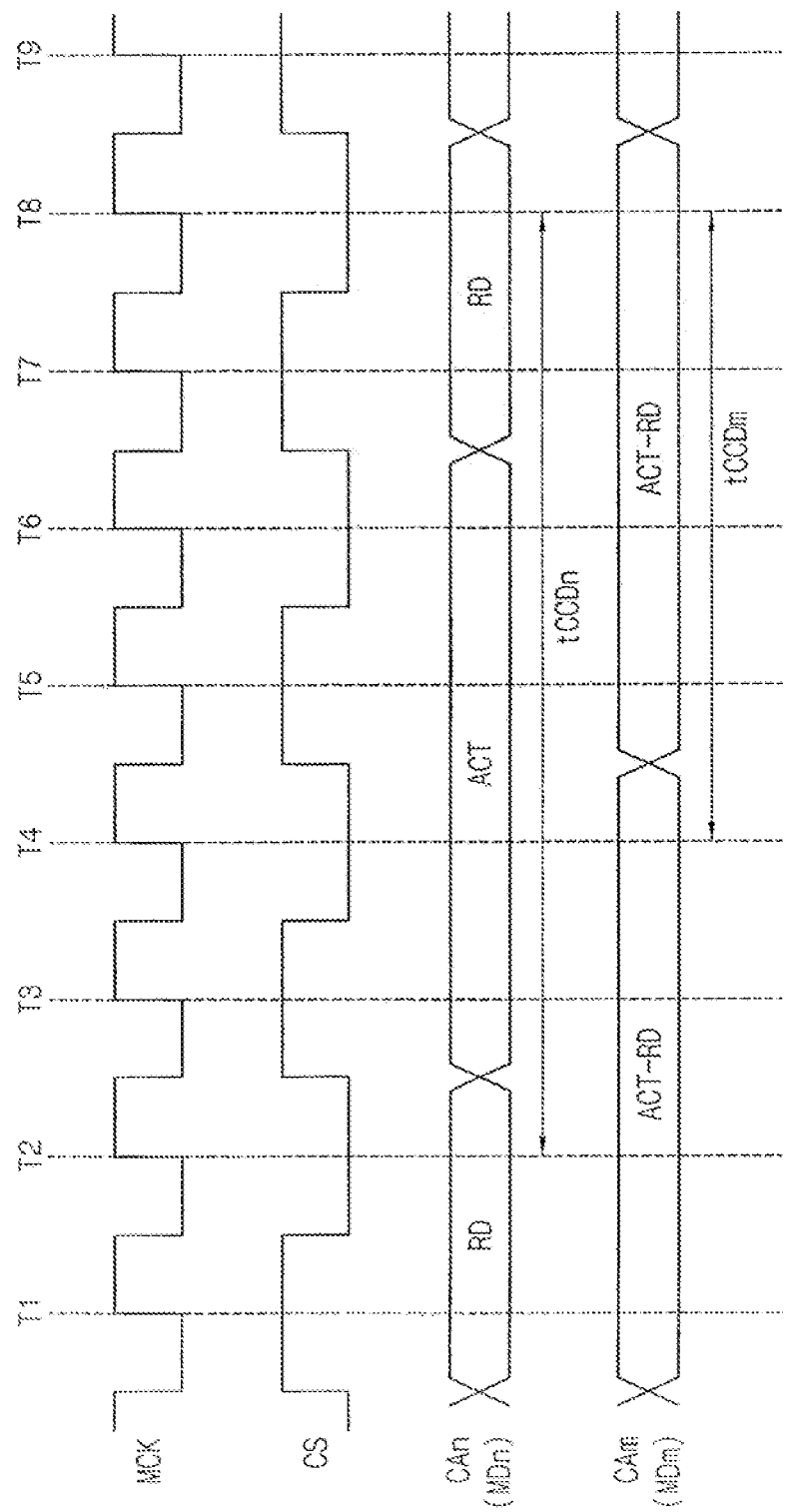
FIG. 12 illustrates example operations in different modes of a memory system.

FIG. 12 is a timing diagram illustrating example operations in a first mode and a second mode. Referring to FIG. 12, the command may be determined as the combination of the chip selection signal CS and the command-address signals CA at the rising edges T1~T9 of the main clock signal MCK. The examples of the combination of the chip selection signal CS and the command-address signals CA are illustrated in FIG. 11. FIG. 12 illustrates the command-address signals May in the first mode or the normal mode and the command-address signals CAm in the second mode or the mixed mode.

The first command may be transferred continuously during a plurality of clock cycles in the first mode. The mixture of the first command and the second command may be transferred in the second mode. As illustrated in FIG. 12, the first command may be the active command ACT and the second command may be the CAS command. FIG. 12 illustrates the read command RD as an example of the CAS command and the CAS command may be the write command WR.

The memory controller 200 in FIG. 2 may transmit the active command ACT during the four clock cycles corresponding to the four rising edges T3, T4, T5, and T6 of the main clock signal MCK. The memory controller 200 may then transmit the CAS command RD during the two clock cycles corresponding to the two rising edges T7 and T8 in the first mode.

In one embodiment, the memory controller 200 may transmit the combined active-CAS command ACT-RD during the four clock cycles corresponding to the four rising edges T1, T2, T3, and T4, and may transmit the next combined active-CAS command ACT-RD during the four clock cycles corresponding to the four rising edges T5, T6, T7 and T8.

As illustrated in FIG. 12, the CAS-to-CAS delay time (tCCD) corresponding to the time duration between the two successive CAS commands may be reduced by adopting the second mode for mixing the two commands. The tCCDn in the first mode corresponds to the 6 clock cycles but the tCCDm in the second mode may be reduced to the 4 clock cycles. Through the reduction of the tCCD, a DQ bubble, in which data transfer is not performed continuously, may be prevented and utilization of the data bus may be enhanced.

Figure 13:
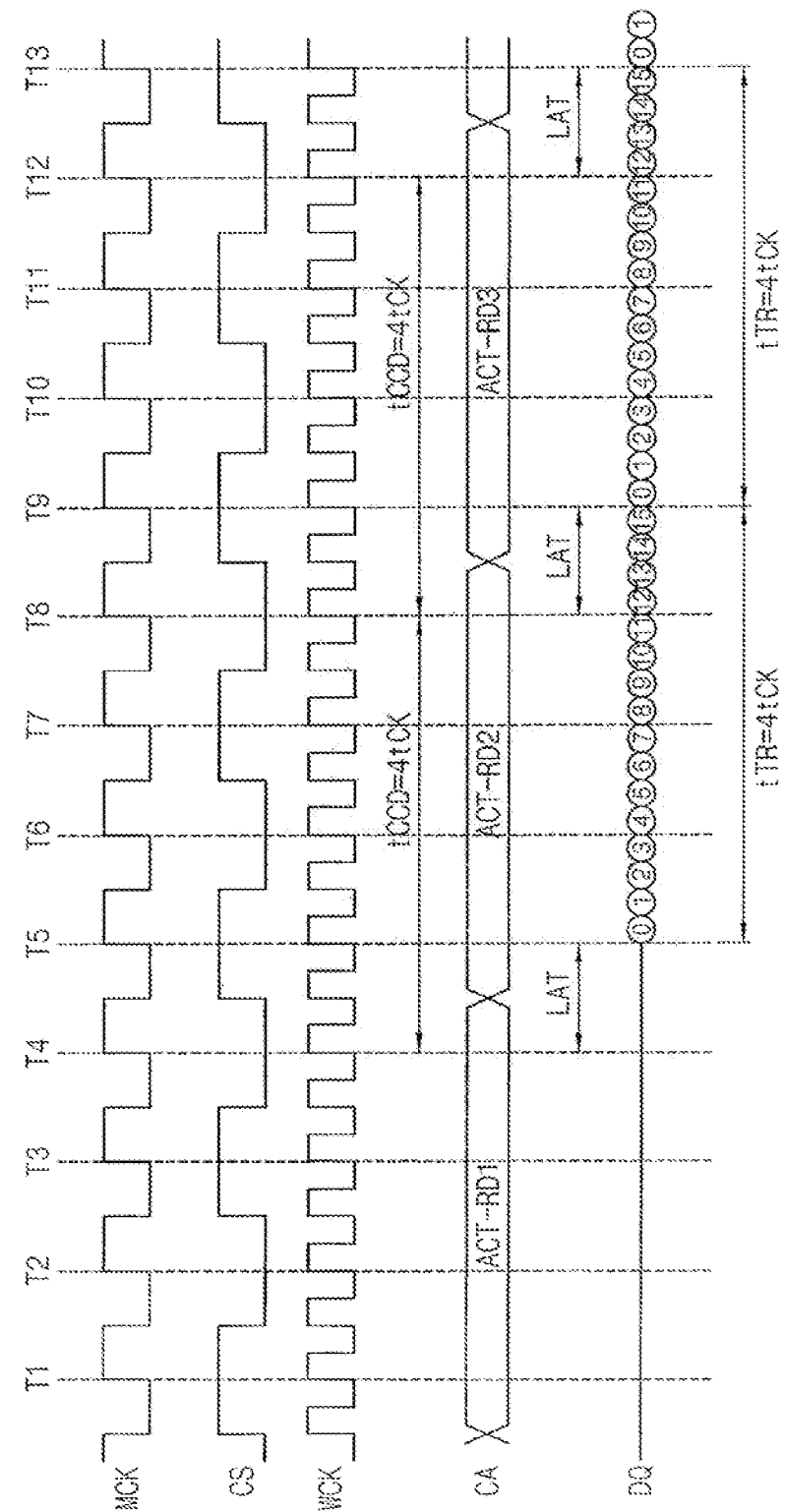
FIG. 13 illustrates an example of signal transfer in a second mode.

FIG. 13 is a timing diagram illustrating an example of a signal transfer in a second mode. In particular, FIG. 13 illustrates command transfer and command latch timing in the second mode when a first access operation and a second access operation are performed successively. As described above, the command may be determined as the combination of the chip selection signal CS and the command-address signals CA at the rising edges T1~T13 of the main clock signal MCK.

Referring to FIG. 13, a first active-CAS command ACT-RD1 for a first access operation, a second active-CAS command ACT-RD2 for a second access operation, and a third active-CAS command ACT-RD3 for a third access operation may be transferred successively from the memory controller to the memory device. FIG. 13 illustrates the active-read command ACT-RD as an example of the combined command and the combined command may be the active-write command ACT-WR.

The memory controller 200 in FIG. 2 may transmit the first active-CAS command ACT-RD1 during the 4 clock cycles corresponding to the 4 rising edges T1, T2, T3, and T4 of the main clock signal MCK in the second mode, and may transmit the second active-CAS command ACT-RD2 during the 4 clock cycles corresponding to the 4 rising edges T5, T6, T7, and T8 of the main clock signal MCK in the second mode. The memory controller 200 may then transmit the third active-CAS command ACT-RD3 during the 4 clock cycles corresponding to the 4 rising edges T9, T10, T11, and T12 of the main clock signal MCK in the second mode. As a result, the tCCD between the two consecutive active-CAS commands ACT-RD1 and ACT-RD2 may correspond to the 4 clock cycles 4tCK.

FIG. 13 illustrates data transfer in the second mode which is performed in synchronization with the data clock signal WCK with the burst length of 16. In this case, the data transfer time tTR for one access operation corresponds to the 4 clock cycles 4tCK of the main clock signal MCK.

Transfer of the data bits 0-15 may begin through the data bus or the data pin DQ after a predetermined latency LAT from the respective time points T4, T8, and T12 when the active-CAS commands ACT-RD1, ACT-RD2, and ACT-RD3 are received by the memory device through the control bus. The latency LAT may be the read latency when the combined command is the active-read command ACT-RD. The latency LAT may be the write latency when the combined command is the active-write command ACT-WR. FIG. 13 illustrates the latency LAT of the one clock cycle for convenience of illustration. The latency LAT may be determined in various ways depending on configuration of the memory system and/or type of the access operation.

As illustrated in FIG. 13, the data transfer time tTR for each access operation may be the four clock cycles 4tCK of the main clock signal MCK and also the tCCD between the two consecutive active-CAS commands ACT-RD1 and ACT-RD2 may be the 4 clock cycles 4tCK of the main clock signal MCK. As such, a DQ bubble, for example, as illustrated in FIG. 8, may be removed if the tCCD is equal to the data transfer time tTR and the data transfer for the consecutive access operations may be performed continuously.

The memory system and the method of operating the memory system according to example embodiments may therefore reduce the tCCD by adopting the second mode for mixing the two commands. Through the reduction of the tCCD, the DQ bubble, in which data transfer is not performed continuously, may be prevented and utilization of the data bus may be enhanced.

Figure 14:
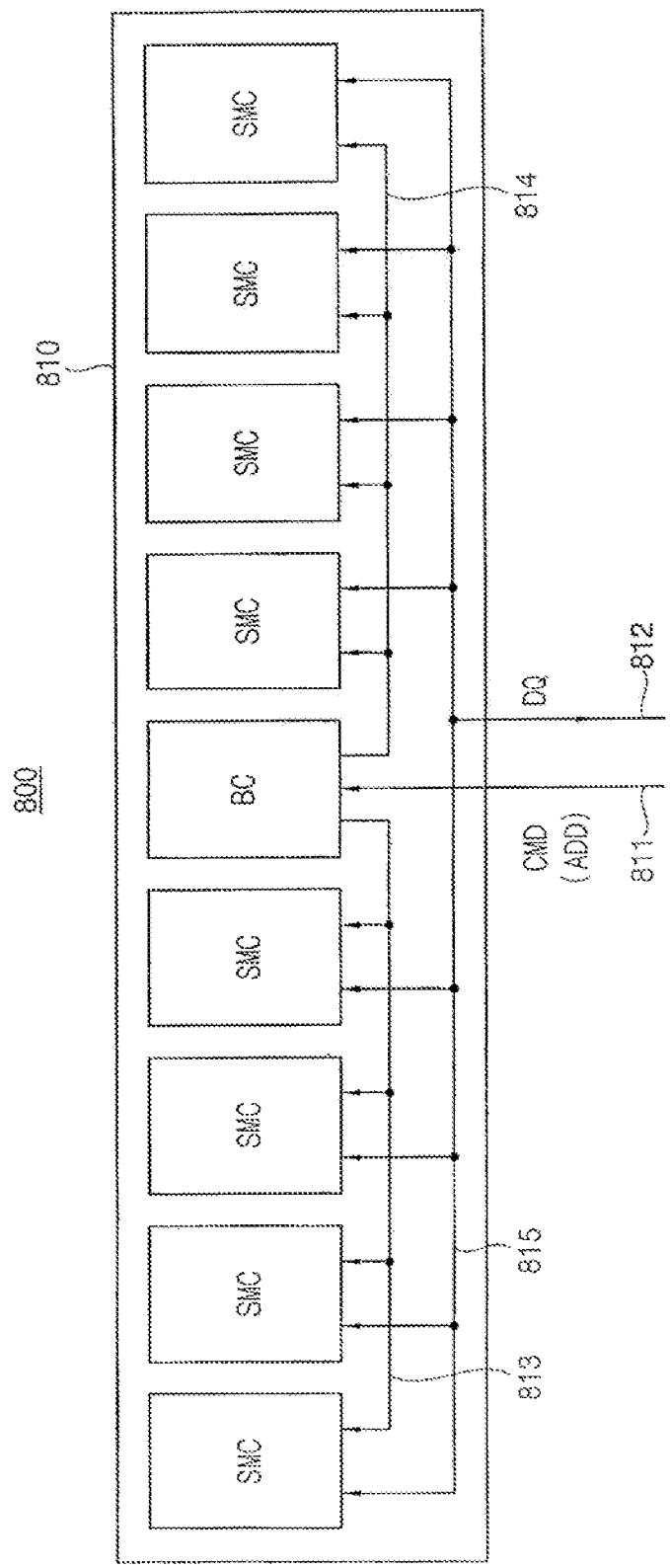
FIG. 14 illustrates an embodiment of a memory module.

FIG. 14 illustrates an embodiment of a memory module 800 which includes a module substrate 810, a plurality of semiconductor memory chips SMC and a buffer chip BC. The semiconductor memory chips SMC may be mounted on the module substrate 810. Each of the semiconductor memory chips SMC may receive data DQ from an external device such as a memory controller through a data bus 812 in a write mode, or may transmit the data DQ to the external device through the data bus 812 in a read mode.

The buffer chip BC may be mounted on the module substrate 810 and the buffer chip BC may receive command signals CMD and address signals ADD through a control bus 511, to provide the received signals CMD and ADD to the semiconductor memory chips SMC through internal buses 513 and 514. The buffer chip BC may include a register to store control information of the memory module 800.

An external device, such as the memory controller, may selectively operate in a first mode or a second mode. In the first mode, the external device may transmit a first command continuously during a plurality of clock cycles. In the second mode, the external device may mix a second command with the first command and may transmit the mixture of the first command and the second command. Each of the semiconductor memory chips SMC may change command latch timing depending on the first mode or the second mode. The tCCD may be reduced by adopting the second mode for mixing the two commands. Through the reduction of the tCCD, a DQ bubble, in which data transfer is not performed continuously, may be prevented and utilization of the data bus may be enhanced.

Figure 15:
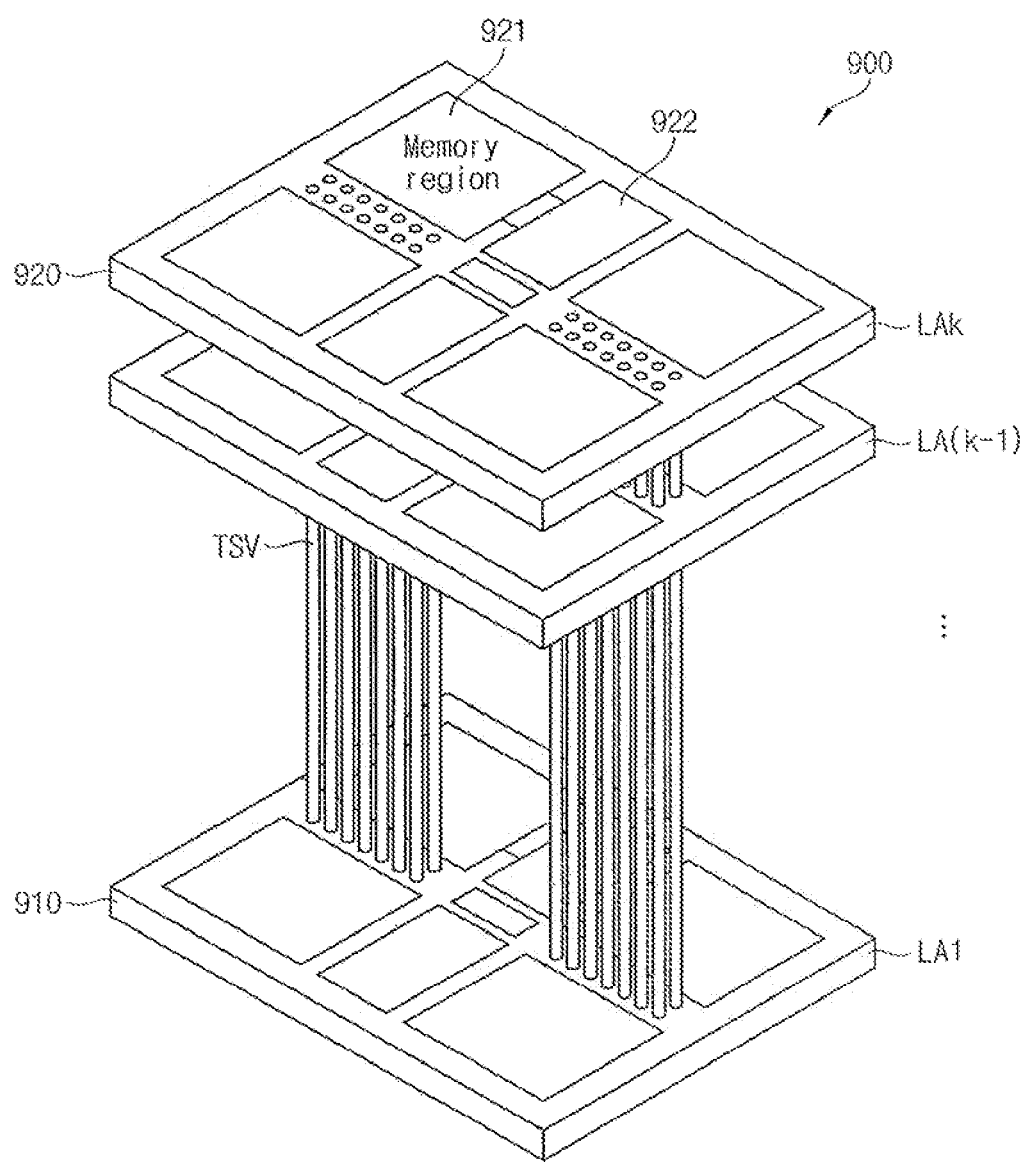
FIG. 15 illustrates an embodiment of a stacked memory device.

FIG. 15 illustrates an embodiment of a stacked memory device 900 which includes first through kth semiconductor integrated circuit layers LA1 through LAk. The lowest first semiconductor integrated circuit layer LA1 may be a master layer. The other semiconductor integrated circuit layers LA2 through LAk may be slave layers.

The first through kth semiconductor integrated circuit layers LA1 through LAk may transmit and receive signals between the layers by through-substrate vias (e.g., through-silicon vias (TSVs)). The lowest first semiconductor integrated circuit layer LA1, as the master layer, may communicate with an external memory controller through a conductive structure formed on an external surface.

The first semiconductor integrated circuit layer 910 through the kth semiconductor integrated circuit layer 920 may include memory regions 921 and various peripheral circuits 922 for driving the memory regions 921. For example, the peripheral circuits may include a row (X)-driver for driving word lines of a memory, a column (Y)-driver for driving bit lines of the memory, a data input/output unit for controlling input/output of data, a command buffer for receiving a command from an external device and buffering the command, and an address buffer for receiving an address from an external device and buffering the address.

The first semiconductor integrated circuit layer 910 may further include control logic which generates control signals to control the memory region 921 based on the command-address signals from the memory controller.

According to example embodiments, the stacked memory device 900 may change command latch timing depending on the first mode or the second mode as described above. The tCCD may be reduced by adopting the second mode for mixing the two commands. Through the reduction of the tCCD, a DQ bubble, in which data transfer is not performed continuously, may be prevented and utilization of the data bus may be enhanced.

Figure 16:
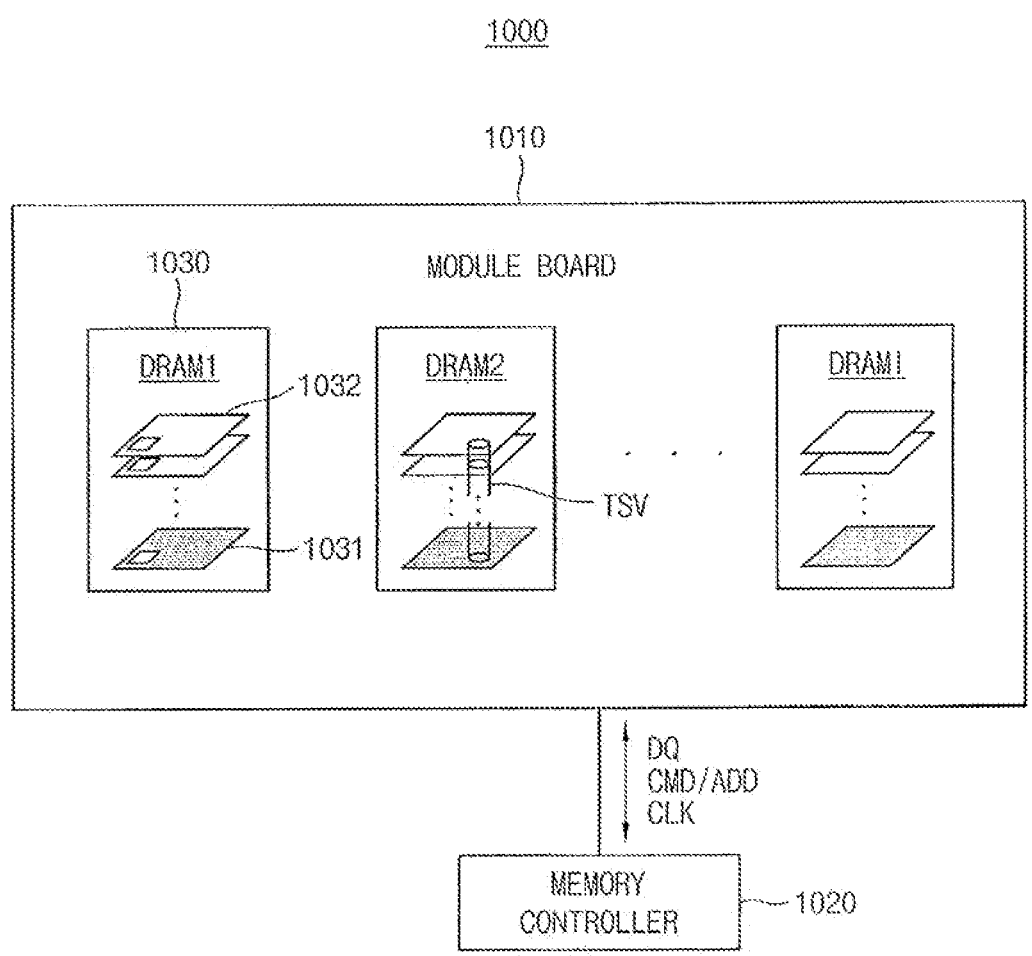
FIG. 16 illustrates an embodiment of a memory system.

FIG. 16 illustrates an embodiment of a memory system 1000 which includes a memory module 1010 and a memory controller 1020. The memory module 1010 may include at least one semiconductor memory device 1030 mounted on a module substrate. For example, the semiconductor memory device 1030 may be constructed as a DRAM chip. In addition, the semiconductor memory device 1030 may include a stack of semiconductor dies. In some example embodiments, the semiconductor dies may include the master die 1031 and the slave dies 1032. Signal transfer between the semiconductor chips may occur via through-substrate vias (e.g., TSVs) and/or bonding wires.

The memory module 1010 may communicate with the memory controller 1020 via a system bus. Data DQ, a command/address CMD/ADD, and a clock signal CLK may be transmitted and received between the memory module 1010 and the memory controller 1020 via the system bus.

As described above, the memory controller 1020 may selectively operate in a first mode, to transmit a first command continuously during a plurality of clock cycles, or in a second mode to mix a second command with the first command and transmit the mixture of the first command and the second command. Each of the semiconductor memory devices 1030 may change command latch timing depending on the first mode or the second mode. The tCCD may be reduced by adopting the second mode for mixing the two commands. Through the reduction of the tCCD, a DQ bubble, in which data transfer is not performed continuously, may be prevented and utilization of the data bus may be enhanced.

Figure 17:
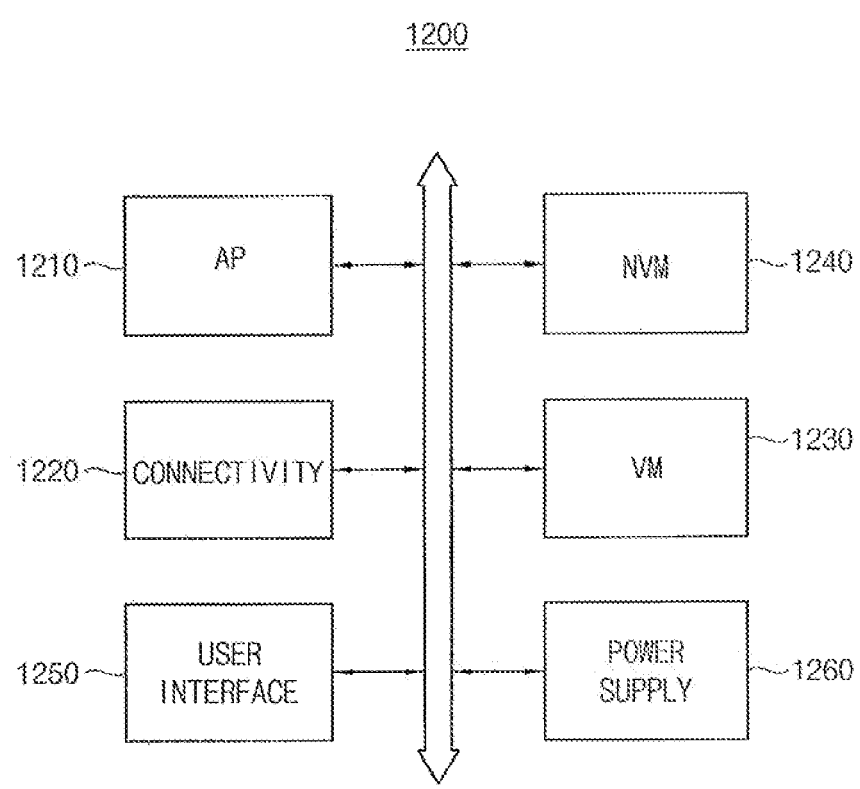
FIG. 17 illustrates an embodiment of a mobile system.

FIG. 17 illustrates an embodiment of a mobile system 1200 which includes an application processor 1210, a connectivity unit 1220, a volatile memory device (VM) 1230, a nonvolatile memory device 1240, a user interface 1250, and a power supply 1260. In some embodiments, the mobile system 1200 may be a mobile phone, a smart phone, a personal digital assistant (PDA), a portable multimedia player (PMP), a digital camera, a music player, a portable game console, a navigation system, or another type of electronic device.

The application processor 1210 may execute applications such as a web browser, a game application, a video player, etc. In some embodiments, the application processor 1210 may include a single core or multiple cores. For example, the application processor 1210 may be a multi-core processor such as a dual-core processor, a quad-core processor, a hexa-core processor, etc. The application processor 1210 may include an internal or external cache memory.

The connectivity unit 1220 may perform wired or wireless communication with an external device. For example, the connectivity unit 1220 may perform Ethernet communication, near field communication (NFC), radio frequency identification (RFID) communication, mobile telecommunication, memory card communication, universal serial bus (USB) communication, etc. In some embodiments, connectivity unit 1220 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 1230 may store data processed by the application processor 1210, or may operate as a working memory. For example, the volatile memory device 1230 may be a dynamic random access memory, such as DDR SDRAM, LPDDR SDRAM, GDDR SDRAM, RDRAM, etc. The nonvolatile memory device 1240 may store a boot image for booting the mobile system 1200. For example, the nonvolatile memory device 1240 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The application processor 1210 may generate commands for controlling the memory devices 1230 and 1240. The application processor 1210 may selectively operate in a first mode to transmit a first command continuously during a plurality of clock cycles or in a second mode to mix a second command with the first command and transmit a mixture of the first command and the second command. Each of the memory devices 1230 and 1240 may change command latch timing depending on the first mode or the second mode. The tCCD may be reduced by adopting the second mode for mixing the two commands. Through the reduction of the tCCD, the DQ bubble, in which data transfer is not performed continuously, may be prevented and utilization of the data bus may be enhanced.

The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIS), and/or a storage device, such as a memory card, a solid state drive (SSD), a hard disk drive (HDD), a CD-ROM, etc.

In some embodiments, the mobile system 1200 and/or components of the mobile system 1200 may be packaged in various forms. Examples include package-on-package (PoP), ball grid arrays (BGAs), chip scale packages (CSPs), plastic leaded chip carrier (PLCC), plastic dual in-line package (PDIP), die-in-waffle pack, die-in-wafer form, chip-on-board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system-in-package (SIP), multi-chip package (MCP), wafer-level fabricated package (WFP), wafer-level processed stack package (WSP), etc.

Figure 18:
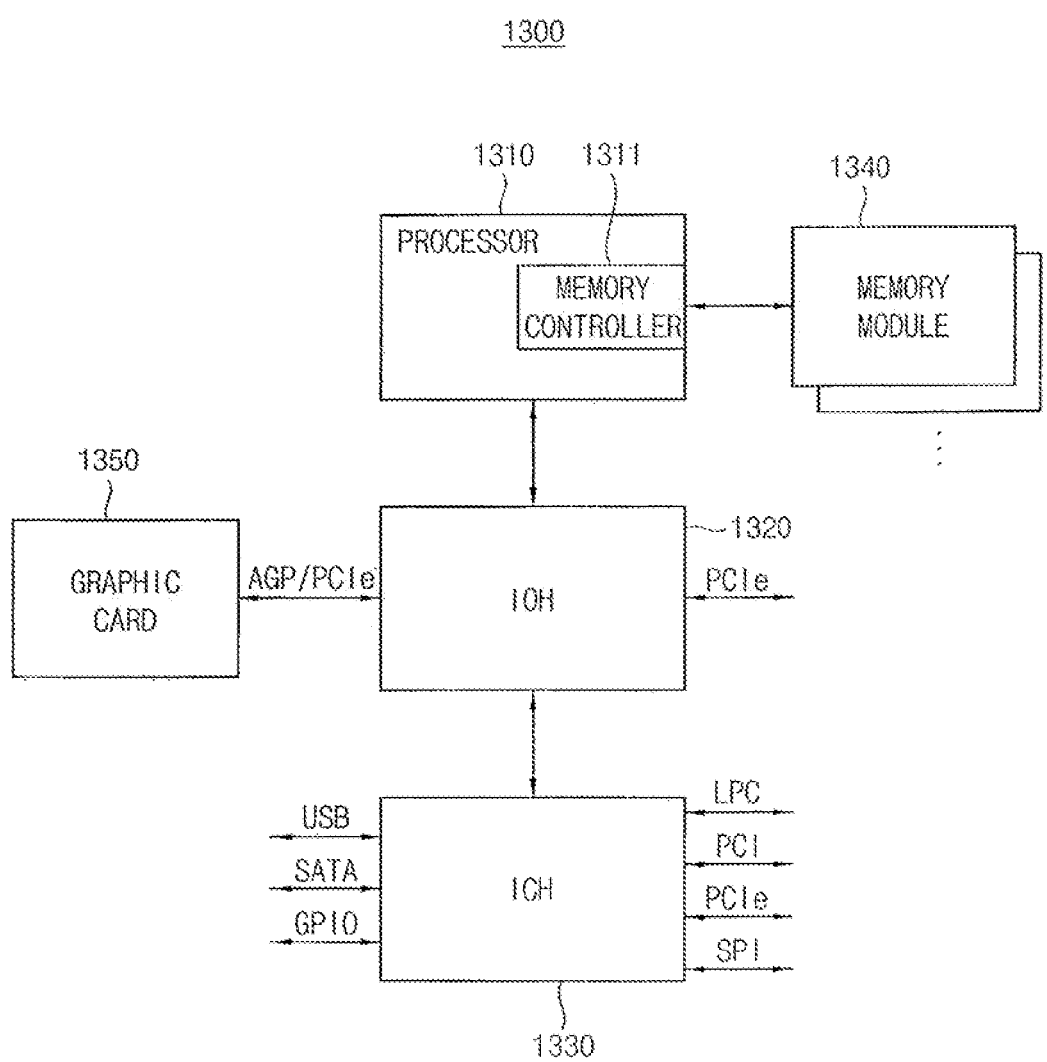
FIG. 18 illustrates an embodiment of a computing system.

FIG. 18 illustrates an embodiment of a computing system 1300 which includes a processor 1310, an input/output hub (IOH) 1320, an input/output controller hub (ICH) 1330, at least one memory module 1340, and a graphics card 1350. In some embodiments, the computing system 1300 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, navigation system, etc.

The processor 1310 may perform various computing functions such as executing specific software for performing specific calculations or tasks. For example, the processor 1310 may be a microprocessor, a central process unit (CPU), a digital signal processor, or the like. In some embodiments, the processor 1310 may include a single core or multiple cores. For example, the processor 1310 may be a multi-core processor, such as a dual-core processor, a quad-core processor, a hexa-core processor, etc. Although FIG. 18 illustrates the computing system 1300 including one processor 1310, in some embodiments, the computing system 1300 may include a plurality of processors. The processor 1310 may include an internal or external cache memory.

The processor 1310 may include a memory controller 1311 for controlling operations of the memory module 1340. The memory controller 1311 included in the processor 1310 may be referred to as an integrated memory controller (IMC). A memory interface between the memory controller 1311 and the memory module 1340 may be implemented with a single channel including a plurality of signal lines, or may bay be implemented with multiple channels, to each of which at least one memory module 1340 may be coupled. In some embodiments, the memory controller 1311 may be located inside the input/output hub 1320, e.g., a memory controller hub (MCH).

The memory module 1340 may include at least one memory chip. The memory controller 1311 may selectively operate in a first mode to transmit a first command continuously during a plurality of clock cycles or in a second mode to mix a second command with the first command and transmit a mixture of the first command and the second command. The chip in the memory module 1340 may change command latch timing depending on the first mode or the second mode. The tCCD may be reduced by adopting the second mode for mixing the two commands. Through the reduction of the tCCD, a DQ bubble, in which data transfer is not performed continuously, may be prevented and utilization of the data bus may be enhanced.

The input/output hub 1320 may manage data transfer between processor 1310 and devices, such as the graphics card 1350. The input/output hub 1320 may be coupled to the processor 1310 via various interfaces. For example, the interface between the processor 1310 and the input/output hub 1320 may be a front side bus (FSB), a system bus, a HyperTransport, a lightning data transport (LDT), a QuickPath interconnect (QPI), a common system interface (CSI), etc.

Although FIG. 18 illustrates the computing system 1300 including one input/output hub 1320, in some embodiments, the computing system 1300 may include a plurality of input/output hubs. The input/output hub 1320 may provide various interfaces with the devices. For example, the input/output hub 1320 may provide an accelerated graphics port (AGP) interface, a peripheral component interface-express (PCIe), a communications streaming architecture (CSA) interface, etc.

The graphics card 1350 may be coupled to the input/output hub 1320 via AGP or PCIe. The graphics card 1350 may control a display device (not shown) for displaying an image. The graphics card 1350 may include an internal processor for processing image data and an internal memory device. In some embodiments, the input/output hub 1320 may include an internal graphics device along with or instead of the graphics card 1350 outside the graphics card 1350. The graphics device included in the input/output hub 1320 may be referred to as integrated graphics. Further, the input/output hub 1320 including the internal memory controller and the internal graphics device may be referred to as a graphics and memory controller hub (GMCH).

The input/output controller hub 1330 may perform data buffering and interface arbitration to efficiently operate various system interfaces. The input/output controller hub 1330 may be coupled to the input/output hub 1320 via an internal bus, such as a direct media interface (DMI), a hub interface, an enterprise Southbridge interface (ESI), PCIe, etc. The input/output controller hub 1330 may provide various interfaces with peripheral devices. For example, the input/output controller hub 1330 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1310, the input/output hub 1320 and the input/output controller hub 1330 may be implemented as separate chipsets or separate integrated units. In other embodiments, at least two of the processor 1310, the input/output hub 1320 and the input/ output controller hub 1330 may be implemented as a single chipset. Also, while many features of the embodiments are disclosed as units, in other embodiments those features may be implemented as other forms of logic including but not limited to code-based operations performed by a processor.

The memory system and the method of operating the memory system according to example embodiments may reduce a CAS-to-CAS delay time (tCCD) or maintain the tCCD in a minimum value by adopting an operation for mixing two commands. Through the reduction of the tCCD, a DQ bubble, in which data transfer is not performed continuously, may be prevented and utilization of a data bus may be enhanced.

The embodiments described herein may be applied to arbitrary devices and systems including a memory device. For example, the embodiments may be applied to a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

In accordance with another embodiment, an apparatus includes an interface coupled to a memory. The interface may be one or more of signal or bus lines corresponding to the aforementioned embodiments. The memory controller selectively operates in a first mode and a second mode. The memory controller transmits a first command continuously through the interface during a plurality of clock cycles in the first mode. The memory controller mixes a second command with the first command and transmits the mixture of the first command and the second command through the interface in the second mode. The memory controller may insert the second command between the clock cycles of the first command in the second mode. The memory controller may include flag information in the first command transmitted through the interface to the memory, wherein the flag information is indicative of a change in command latch timing for the memory. The memory controller may correspond to the memory controller in any of the aforementioned embodiments.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The controllers, control logic, decoders, and other processing features of the embodiments described herein may be implemented in logic which, for example, may include hardware, software, or both. When implemented at least partially in hardware, the controllers, control logic, decoders, and processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, control logic, decoders, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods herein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A dynamic random access memory (DRAM) device operating in synchronization with a clock signal, the DRAM device comprising:
   a memory cell array including a plurality of memory cells; and
   a control logic configured to receive a command which is split into a first portion and a second portion, the first portion of the command including a first portion of an address and the second portion of the command including a second portion of the address, the first portion and the second portion of the address, combined together, indicating a location of memory cells operating in response to the command,
   wherein the control logic, during a first operating mode, receives the first portion of the command and the second portion of the command at first and second rising edges of the clock signal respectively in which the second rising edge follows the first rising edge after a first number of clock cycles, and during a second operating mode, receives the first portion of the command and the second portion of the command at third and fourth rising edges of the clock signal respectively in which the fourth rising edge follows the third rising edge after a second number of clock cycles, and the first number and the second number are different from each other.

2. The DRAM device of claim 1, wherein one of the first operating mode and the second operating mode is pre-programmed in the DRAM device through a mode register setting operation.

3. The DRAM device of claim 1, wherein one of the first operating mode and the second operating mode is determined through mode information included in the first portion of the command.

4. The DRAM device of claim 1, wherein a bank address is included only in the first portion of the command.

5. The DRAM device of claim 1, wherein the control logic is configured to receive the command during 2*N clock cycles, the N being an integer.

6. The DRAM device of claim 1, wherein the first portion of the command is received while a chip selection signal is logic level high.

7. The DRAM device of claim 1, wherein the command is an active command.

8. The DRAM device of claim 7, wherein a CAS command comes between the first portion of the command and the second portion of the command.

9. The DRAM device of claim 8, wherein the CAS command is a read command or a write command.

10. The DRAM device of claim 9, wherein a second CAS command comes after the second portion of the command, and a delay between the CAS command and the second CAS command is tCCD where the tCCD is a minimally required delay between two consecutive CAS commands.

11. A memory controller for controlling a dynamic random access memory (DRAM) device in synchronization with a clock signal, the memory controller comprising:
a control logic configured to generate a command which is split into a first portion and a second portion, the first portion of the command including a first portion of an address and the second portion of the command including a second portion of the address, the first portion and the second portion of the address, combined together, indicating a location of memory cells of the DRAM device operating in response to the command; and
a transmitter configured to transmit the command in synchronization with the clock signal,
wherein the control logic, during a first operating mode, transmits the first portion of the command and the second portion of the command at first and second rising edges of the clock signal respectively in which the second rising edge follows the first rising edge after a first number of clock cycles, and during a second operating mode, transmits the first portion of the command and the second portion of the command at third and fourth rising edges of the clock signal respectively in which the fourth rising edge follows the third rising edge after a second number of clock cycles, and the first number and the second number are different from each other.

12. The memory controller of claim 11, wherein the memory controller is further configured to pre-program a mode register of the DRAM device to determine an operating mode of the DRAM device as one of the first operating mode and the second operating mode.

13. The memory controller of claim 11, wherein the memory controller is further configured to include mode information in the first portion of the command to determine an operating mode of the DRAM device as one of the first operating mode and the second operating mode.

14. The memory controller of claim 11, wherein a bank address is included only in the first portion of the command.

15. The memory controller of claim 11, wherein the control logic is configured to transmit the command during 2*N clock cycles, the N being an integer.

16. The memory controller of claim 11, wherein the first portion of the command is transmitted along with a chip selection signal that is logic level high.

17. The memory controller of claim 11, wherein the command is an active command.

18. The memory controller of claim 17, wherein the memory controller transmits a CAS command between the first portion of the command and the second portion of the command.

19. The memory controller of claim 18, wherein the CAS command is a read command or a write command.

20. The memory controller of claim 19, wherein the memory controller further transmits a second CAS command after the second portion of the command, and a delay between the CAS command and the second CAS command is tCCD where the tCCD is a minimally required delay between two consecutive CAS commands.

* * * * *